US012035533B2

(12) United States Patent
Lee

(10) Patent No.: US 12,035,533 B2
(45) Date of Patent: Jul. 9, 2024

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 419 days.

(21) Appl. No.: 17/317,289

(22) Filed: May 11, 2021

(65) Prior Publication Data

US 2022/0149053 A1 May 12, 2022

(30) Foreign Application Priority Data

Nov. 9, 2020 (KR) ........................ 10-2020-0148724

(51) Int. Cl.
*H10B 43/35* (2023.01)
*H10B 41/27* (2023.01)
*H10B 41/35* (2023.01)
*H10B 43/27* (2023.01)

(52) U.S. Cl.
CPC ............. *H10B 43/35* (2023.02); *H10B 41/27* (2023.02); *H10B 41/35* (2023.02); *H10B 43/27* (2023.02)

(58) Field of Classification Search
CPC .... H10B 43/35; H10B 43/27; H10B 43/5386; H10B 43/10; H10B 43/30; H10B 41/35; H10B 41/27; H01L 21/76895; H01L 21/76877; H01L 29/401; H01L 29/4234; H01L 29/42356
See application file for complete search history.

(56) References Cited

U.S. PATENT DOCUMENTS 9,419,135 B2 8/2016 Baenninger et al.
9,679,907 B1 * 6/2017 Kaneko .................. H10B 43/35
9,748,264 B1 * 8/2017 Jiang ...................... H10B 43/35
10,050,057 B2 * 8/2018 Lee ........................ H01L 23/528
10,256,252 B1 * 4/2019 Kanazawa ........ H01L 29/40117
2004/0198008 A1 * 10/2004 Tsai .................. H01L 21/76895
257/E21.507

(Continued)

FOREIGN PATENT DOCUMENTS

KR 1020170083340 A 7/2017

*Primary Examiner* — Alia Sabur
(74) *Attorney, Agent, or Firm* — WILLIAM PARK & ASSOCIATES LTD.

(57) ABSTRACT

A semiconductor memory device and a manufacturing method of a semiconductor memory device are described. The semiconductor memory device includes a gate stack structure including interlayer insulating layers and conductive patterns, which are alternately stacked, a first channel structure penetrating the gate stack structure, a first contact structure connected to the first channel structure, the first contact structure extending onto the gate stack structure, a bit line disposed on the first contact structure and being in contact with the first contact structure, a tunnel insulating layer disposed between the first channel structure and the gate stack structure, a data storage layer disposed between the tunnel insulating layer and the gate stack structure, and a blocking insulating layer disposed between the data storage layer and the gate stack structure, the blocking insulating layer extending between the first contact structure and the gate stack structure.

21 Claims, 23 Drawing Sheets

80
70[1] 73 71
I1
I3
I2
DS
90
CO CL 67 65 63

(56) References Cited

U.S. PATENT DOCUMENTS

| | | | | |
|---|---|---|---|---|
| 2015/0187601 | A1* | 7/2015 | He | H01L 21/76816 257/754 |
| 2016/0043100 | A1* | 2/2016 | Lee | H01L 23/535 257/324 |
| 2016/0211272 | A1* | 7/2016 | Koka | H10B 43/40 |
| 2018/0366487 | A1* | 12/2018 | Okizumi | H10B 43/50 |
| 2019/0027490 | A1* | 1/2019 | Shin | H01L 21/3213 |
| 2019/0333581 | A1* | 10/2019 | Diep | H01L 29/42344 |
| 2019/0355672 | A1* | 11/2019 | Fujita | H01L 23/5226 |
| 2020/0203365 | A1* | 6/2020 | Weng | H01L 21/76877 |
| 2020/0312765 | A1* | 10/2020 | Kawasaki | H10B 43/50 |
| 2021/0066277 | A1* | 3/2021 | Kim | H01L 23/5228 |
| 2021/0320123 | A1* | 10/2021 | Lee | H10B 41/41 |
| 2021/0407569 | A1* | 12/2021 | Young | G11C 11/223 |
| 2022/0028846 | A1* | 1/2022 | Alsmeier | H01L 25/50 |
| 2022/0045087 | A1* | 2/2022 | Baraskar | H10B 41/50 |
| 2022/0139441 | A1* | 5/2022 | Ogawa | G11C 11/4094 365/185.23 |
| 2022/0165667 | A1* | 5/2022 | Yoon | H01L 21/76877 |

* cited by examiner

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2020-0148724, filed on Nov. 9, 2020, in the Korean Intellectual Property Office, the entire disclosure of which is incorporated herein by reference.

BACKGROUND

1. Technical Field

The present disclosure may generally relate to a semiconductor memory device and a manufacturing method of a semiconductor memory device, and more particularly, to a three-dimensional semiconductor memory device and a manufacturing method of a three-dimensional semiconductor memory device.

2. Related Art

A semiconductor memory device may include a memory cell array and word lines and bit lines, which are connected to the memory cell array. The memory cell array includes a plurality of memory cells capable of storing data. A memory cell array of a three-dimensional semiconductor memory device includes a plurality of three-dimensionally arranged memory cells, so that the degree of integration of the memory cell array may be improved.

SUMMARY

In accordance with an embodiment of the present disclosure, a semiconductor memory device may include a gate stack structure including interlayer insulating layers and conductive patterns, which are alternately stacked. A first channel structure may penetrate the gate stack structure. A first contact structure may be connected to the first channel structure, the first contact structure extending onto the gate stack structure. A bit line may be disposed on the first contact structure and may be in contact with the first contact structure. A tunnel insulating layer may be disposed between the first channel structure and the gate stack structure. A data storage layer may be disposed between the tunnel insulating layer and the gate stack structure. In addition, a blocking insulating layer may be disposed between the data storage layer and the gate stack structure, the blocking insulating layer extending between the first contact structure and the gate stack structure.

In accordance with an embodiment of the present disclosure, a method of manufacturing a semiconductor memory device may include forming channel holes penetrating a stack structure, forming a blocking insulating layer including a vertical part disposed on a sidewall of each of the channel holes and a horizontal part extending along a top surface of the stack structure, forming pillar structures respectively in the channel holes opened by the vertical part of the blocking insulating layer, wherein an upper end portion of each of the channel holes is opened, forming a doped semiconductor layer including a first part filling the upper end portion of each of the channel holes and a second part extending from the first part, wherein the second part extends in a direction intersecting the first part to overlap with the stack structure, forming contact holes respectively overlapping with the pillar structures by etching a portion of the doped semiconductor layer, forming contact structures respectively filling the contact holes, and removing the second part of the doped semiconductor layer.

BRIEF DESCRIPTION OF THE DRAWINGS

Illustrative embodiments will now be described hereinafter with reference to the accompanying drawings; however, other embodiments may take on different forms. Therefore, possible embodiments of the present teachings should not be construed as being limited to the specific embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

DETAILED DESCRIPTION

Specific structural or functional descriptions disclosed herein are merely illustrative for the purpose of describing embodiments according to the concept of the present disclosure. Embodiments according to the concept of the present disclosure may be implemented in various forms, and should not be construed as being limited to the specific embodiments set forth herein.

Hereinafter, the terms "first," "second," etc. are used to distinguish one component from another component and are not meant to imply a specific number or order of components. The terms may be used to describe various components, but the components are not limited by the terms.

Embodiments may provide a semiconductor memory device and a manufacturing method of a semiconductor memory device, which are capable of reducing a process failure.

Figure 1:
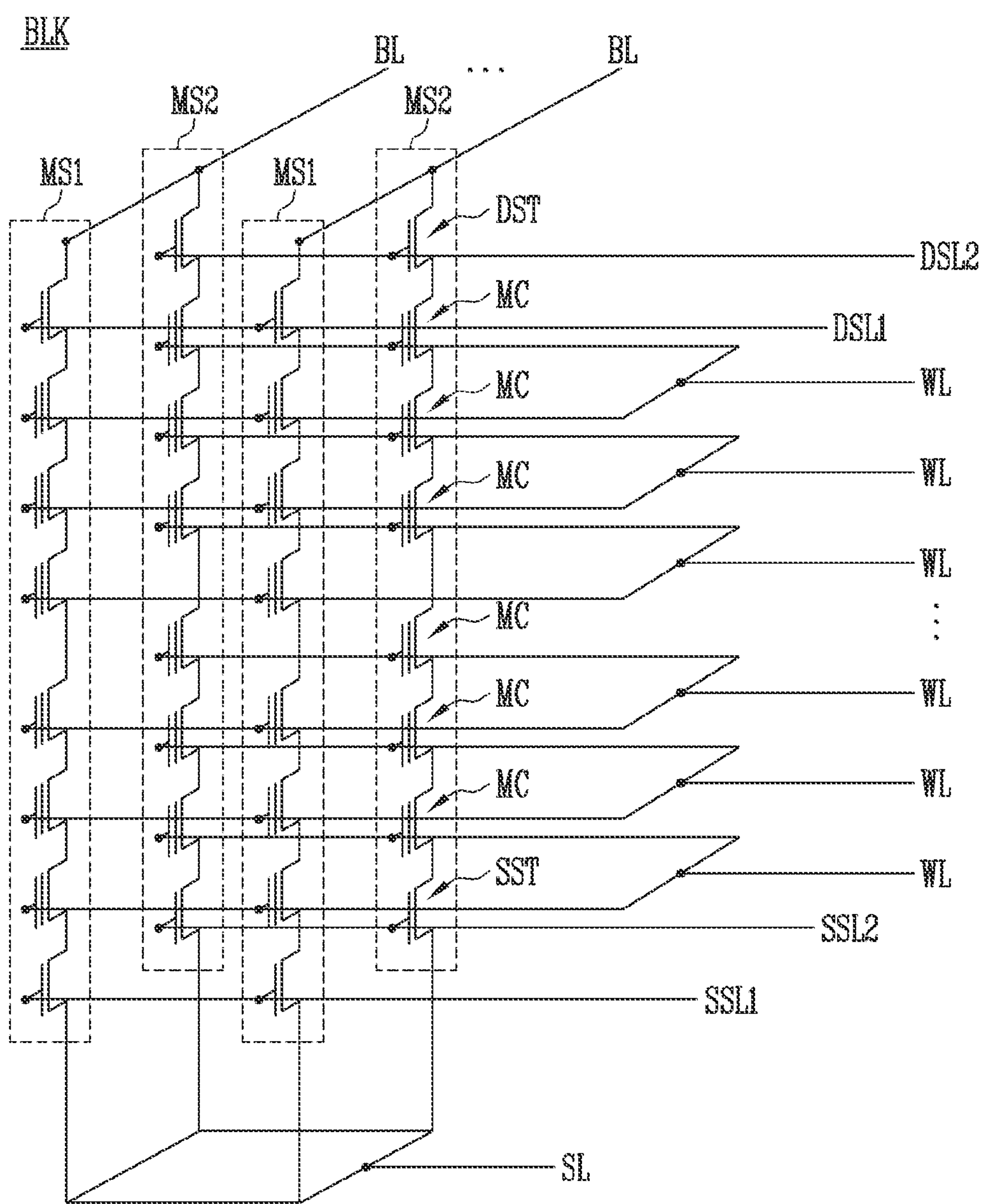
FIG. 1 is a circuit diagram illustrating a memory block of a semiconductor memory device in accordance with an embodiment of the present disclosure.

FIG. 1 is a circuit diagram illustrating a memory block of a semiconductor memory device in accordance with an embodiment of the present disclosure.

Referring to FIG. 1, the semiconductor memory device may include a memory block BLK which has a plurality of memory cell strings MS1 and MS2. The memory cell strings MS1 and MS2 typically have a plurality of memory cells connected in series and are connected to a source line and a plurality of bit lines BL.

Each of the memory cell strings MS1 and MS2 may include a plurality of memory cells MC connected in series, at least one source select transistor SST and at least one drain select transistor DST. In an embodiment, for example, as illustrated in FIG. 1, each of the memory cell strings MS1 and MS2 may include one source select transistor SST connected between the plurality of memory cells MC and the source layer SL. In another embodiment (not shown), each of the memory cell strings MS1 and MS2 may include two or more source select transistors SST connected in series between the plurality of memory cells MC and the source layer SL. In an embodiment, as illustrated in FIG. 1, each of the memory cell strings MS1 and MS2 may include one drain select transistor DST connected between the plurality of memory cells MC and a bit line BL. In another embodiment (not shown), each of the memory cell strings MS1 and MS2 may include two or more drain select transistors DST connected in series between the plurality of memory cells MC and the bit line BL.

As illustrated in FIG. 1, the plurality of memory cells MC may be connected to the source layer SL via the source select transistor SST, and the plurality of memory cells MC may be connected to the bit line BL via the drain select transistor DST.

Gates of source select transistors SST disposed at the same level may be connected to source select lines SSL1 and SSL2 that are isolated from each other. Gates of drain select transistors DST disposed at the same level may be connected to drain select lines DSL1 and DSL2 isolated from each other. Gates of the memory cells MC may be respectively connected to a plurality of word lines WL. The word lines WL may be disposed at different levels, and gates of memory cells MC disposed at the same level may be connected to a single word line WL.

Although the memory block BLK which includes a first source select line SSL1 and a second source select line SSL2, which are isolated from each other at the same level, and includes a first drain select line DSL1 and a second drain select line DSL2, which are isolated from each other at the same level, is exemplified in the drawing, the present disclosure is not limited thereto. In an embodiment, the memory block BLK may include three or more source select lines (not shown) isolated from one another at the same level. Similarly, the memory block BLK may include three or more drain select lines isolated from one another at the same level. In another embodiment, the memory block BLK may include a single source select line connected to gates of source select transistors SST disposed at the same level and two or more drain select lines isolated from each other at the same level.

As illustrated in FIG. 1, the plurality of memory cell strings MS1 and MS2 may be connected to each of the word lines WL. The plurality of memory cell strings MS1 and MS2 may include a first group and a second group, which may be individually selected by the first drain select line DSL1 and the second drain select line DSL2. The first group may include first memory cell strings MS1, and the second group may include second memory cell strings MS2.

With respect to the bit line and the memory cell of the memory cell string connection, memory cells MC of the first memory cell strings MS1 may be respectively connected to the bit lines BL via drain select transistors DST connected to first drain select lines DSL1. Memory cells MC of the second memory cell strings MS2 may be respectively connected to the bit lines BL via drain select transistors DST connected to second drain select lines DSL2. One of the first memory cell strings MS1 and one of the second memory cell strings MS2 may be connected to a single bit line BL.

The memory cells MC of the first memory cell strings MS1 and the memory cells MC of the second memory cell strings MS2 may be connected to the source line SL via source select transistors SST.

Figure 2A:
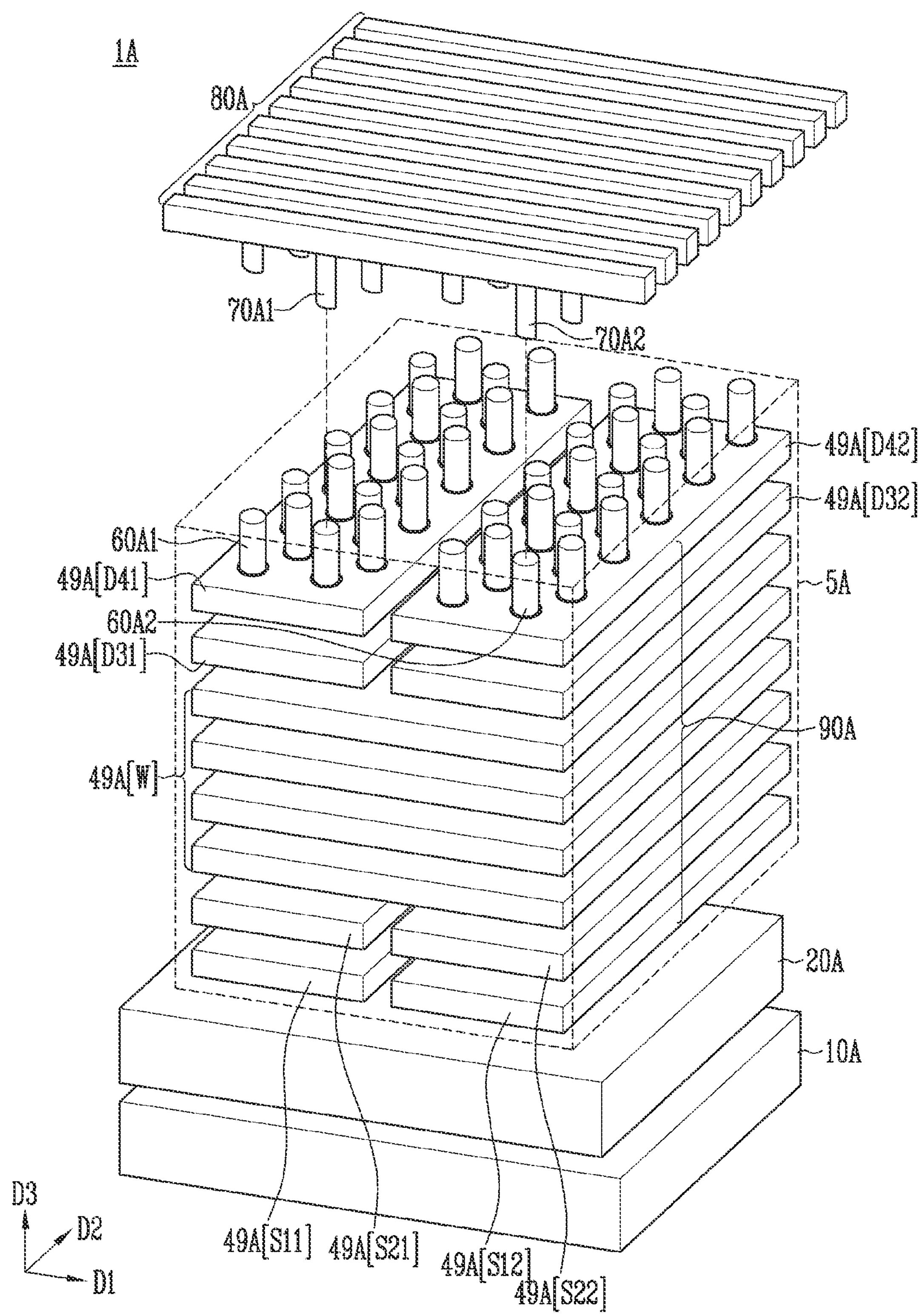
FIGS. 2A and 2B are perspective views illustrating semiconductor memory devices in accordance with embodiments of the present disclosure.
Figure 2B:
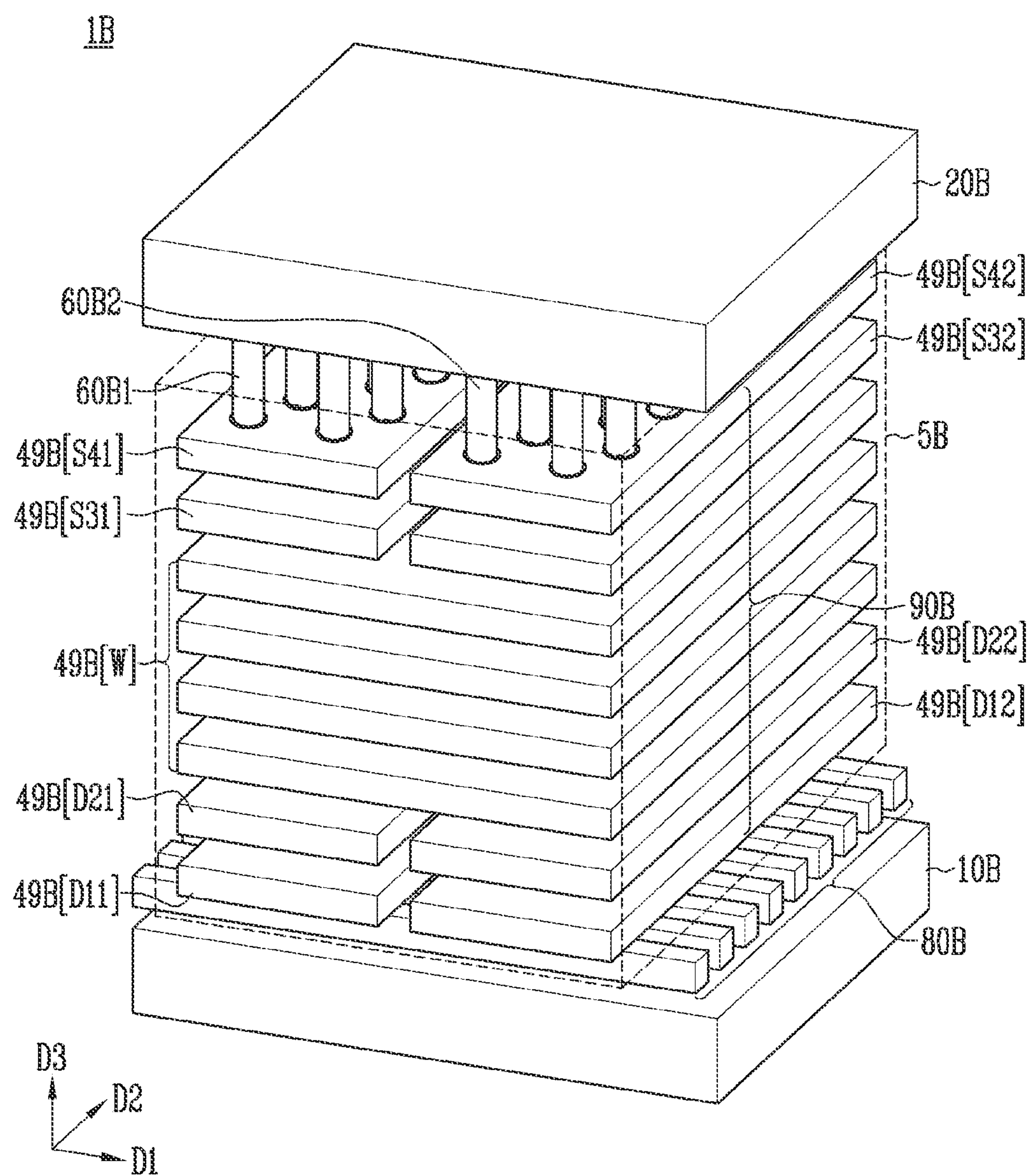

FIGS. 2A and 2B are perspective views illustrating semiconductor memory devices in accordance with embodiments of the present disclosure. FIGS. 2A and 2B illustrate some of components of each of the semiconductor memory devices 1A and 1B, visually providing a view of the stacking structure, so as to help understanding of a structure of each of the semiconductor memory devices 1A and 1B.

Referring to FIGS. 2A and 2B, each of the semiconductor memory devices 1A and 1B may include a peripheral circuit structure 10A or 10B, a memory cell array 5A or 5B, a source layer 20A or 20B, and a plurality of bit lines 80A or 80B.

The peripheral circuit structure 10A or 10B may include a substrate extending in a first direction D1 and a second direction D2. The peripheral circuit structure 10A or 10B may include a peripheral circuit for controlling an operation of the memory cell array 5A or 5B.

As illustrated in FIGS. 2A and 2B, the memory cell array 5A or 5B may overlap with the peripheral circuit structure 10A or 10B. The memory cell array 5A or 5B may be disposed between the source layer 20A or 20B and the plurality of bit lines 80A or 80B.

A direction perpendicular to a plane extending in the first direction D1 and the second direction D2 is defined as a third direction D3. An arrangement of the memory cell array 5A or 5B, the source layer 20A or 20B, and the plurality of bit lines 80A or 80B in the third direction D3 may vary.

Referring to FIG. 2A, the memory cell array 5A may overlap with the peripheral circuit structure 10A with the source layer 20A interposed therebetween. The plurality of bit lines 80A may be located above the memory cell array 5A and overlap with the peripheral circuit structure 10A and the source layer 20A. The source layer 20A and the memory cell array 5A may be interposed between the peripheral circuit structure 10A and the plurality of bit lines 80A.

The memory cell array 5A may include channel structures 60A1 and 60A2 and a gate stack structure 90A surrounding the channel structures 60A1 and 60A2.

As illustrated in FIG. 2A, the gate stack structure 90A may include source select lines 49A[S11], 49A[S12], 49A [S21], and 49A[S22], word lines 49A[W], and drain select lines 49A[D31], 49A[D32], 49A[D41], and 49A[D42]. The source select lines 49A[S11], 49A[S12], 49A[S21], and 49A[S22], the word lines 49A[W], and the drain select lines 49A[D31], 49A[D32], 49A[D41], and 49A[D42] may be disposed to be spaced apart from each other. Conductive materials constituting the source select lines 49A[S11], 49A[S12], 49A[S21], and 49A[S22], the word lines 49A [W], and the drain select lines 49A[D31], 49A[D32], 49A [D41], and 49A[D42] may vary. In an embodiment, the source select lines 49A[S11], 49A[S12], 49A[S21], and 49A[S22] and the drain select lines 49A[D31], 49A[D32], 49A[D41], and 49A[D42] may be formed of the same conductive material as the word lines 49A[W], However, the present disclosure is not limited thereto. In another embodiment, the source select lines 49A[S11], 49A[S12], 49A [S21], and 49A[S22] and the drain select lines 49A[D31], 49A[D32], 49A[D41], and 49A[D42] may be formed of a conductive material different from that of the word lines 49A[W].

The source select lines 49A[S11], 49A[S12], 49A[S21], and 49A[S22] may be disposed between the source layer 20A and the plurality of bit lines 80A. As shown in FIG. 2A, the source select lines 49A[S11], 49A[S12], 49A[S21], and 49A[S22] may include at least one first source select line and at least one second source select line. In an embodiment, the source select lines 49A[S11], 49A[S12], 49A[S21], and 49A[S22] may include two first source select lines 49A[S11] and 49A[S21] and two second source select lines 49A[S12] and 49A[S22]. The two first source select lines 49A[S11] and 49A[S21] may include a first source select line 49A [S11] of a first level and a first source select line 49A[S21] of a second level, which are spaced apart from each other in the third direction D3. The two second source select lines 49A[S12] and 49A[S22] may include a second source select line 49A[S12] of the first level and a second source select line 49A[S22] of the second level, which are spaced apart from each other in the third direction D3. The first source select line 49A[S11] of the first level and the second source select line 49A[S12] of the first level may be spaced apart from each other in the first direction D1. The first source select line 49A[S21] of the second level and the second source select line 49A[S22] of the second level may be spaced apart from each other in the first direction D1.

The drain select lines 49A[D31], 49A[D32], 49A[D41], and 49A[D42] may be disposed above the source select lines 49A[S11], 49A[S12], 49A[S21], and 49A[S22] and below the plurality of bit lines 80A. As shown in FIG. 2A, the drain select lines 49A[D31], 49A[D32], 49A[D41], and 49A[D42] may include at least one first drain select line and at least one second drain select line. In an embodiment, in a similar fashion as the source select lines, the drain select lines 49A[D31], 49A[D32], 49A[D41], and 49A[D42] may include two first drain select lines 49A[D31] and 49A[D41] and two second drain select lines 49A[D32] and 49A[D42]. The two first drain select lines 49A[D31] and 49A[D41] may include a first drain select line 49A[D31] of a third level and a first drain select line 49A[D41] of a fourth level, which are spaced apart from each other in the third direction D3. The two second drain select lines 49A[D32] and 49A[D42] may include a second drain select line 49A[D32] of the third level and a second drain select line 49A[D42] of the fourth level, which are spaced apart from each other in the third direction D3. The first drain select line 49A[D31] of the third level and the second drain select line 49A[D32] of the third level may be spaced apart from each other in the first direction D1. The first drain select line 49A[D41] of the fourth level and the second drain select line 49A[D42] of the fourth level may be spaced apart from each other in the first direction D1.

Each of the word lines 49A[W] may be disposed between the first source select lines 49A[S11] and 49A[S21] and the first drain select lines 49A[D31] and 49A[D41], and may extend between the second source select lines 49A[S12] and 49A[S22] and the second drain select lines 49A[D32] and 49A[D42]. The word lines 49A[W] may be stacked to be spaced apart from each other in the third direction D3.

The channel structures 60A1 and 60A2 may include a channel layer used as a channel region of the memory cell strings MS1 and MS2 shown in FIG. 1. The channel structures 60A1 and 60A2 may be in contact with the source layer 20A. The channel structures 60A1 and 60A2 may penetrate the gate stack structure 90A, and may extend toward the bit lines 80A. The channel structures 60A1 and 60A2 may be connected to the bit lines 80A via contact structures 70A1 and 70A2, as is illustrated in FIG. 2A.

The channel structures 60A1 and 60A2 may include a first channel structure 60A1 controlled by the first drain select lines 49A[D31] and 49A[D41] and a second channel structure 60A2 controlled by the second drain select lines 49A [D32] and 49A[D42]. The first channel structure 60A1 may penetrate the first drain select lines 49A[D31] and 49A [D41], the word lines 49A[W], and the first source select lines 49A[S11] and 49A[S21], and be in contact with the source layer 20A. In similar fashion, the second channel structure 60A2 may penetrate the second drain select lines 49A[S32] and 49A[S42], the word lines 49A[W], and the second source select lines 49A[S12] and 49A[S22], and be in contact with the source layer 20A. Each of the word lines 49A[W] may extend to surround the first channel structure 60A1 and the second channel structure 60A2. Accordingly, the first channel structure 60A1 and the second channel structure 60A2 may be simultaneously controlled by one word line 49A[W].

The contact structures 70A1 and 70A2 may include a first contact structure 70A1 in contact with the first channel structure 60A1 and a second contact structure 70A2 in contact with the second channel structure 60A2. One bit line 80A may be simultaneously connected to one first channel structure 60A1 and one second channel structure 60A2 via a pair of first and second contact structures 70A1 and 70A2.

Referring to FIG. 2B, the memory cell array 5B may overlap with the peripheral circuit structure 10B with the plurality of bit lines 80B interposed therebetween. The source layer 20B may overlap with the peripheral circuit structure 10B with the plurality of bit lines 80B and the memory cell array 5B. The plurality of bit lines 80B and the memory cell array 5B may be interposed between the source layer 20B and the peripheral circuit structure 10B. The location of bit lines 80B are opposed to the location of bit lines 80A in FIG. 2A which are located above the source layers 20A.

The memory cell array 5B may include channel structures 60B1 and 60B2 and a gate stack structure 90B surrounding the channel structures 60B1 and 60B2.

As illustrated in FIG. 2B, the gate stack structure 90B may include word lines 49B[W], drain select lines 49B[D11], 49B[D12], 49B[D21], and 493[D22], and source select lines 49B[S31], 49B[S32], 49B[S41], and 49B[S42]. Conductive materials constituting the word lines 49B[W], the drain select lines 49B[D11], 49B[D12], 49B[D21], and 49B[D22], and the source select lines 49B[S31], 49B[S32], 49B[S41], and 49B[S42] may be various. Hereinafter, detailed descriptions of components overlapping with those shown in FIG. 2A will be omitted.

The drain select lines 49B[D11], 49B[D12], 49B[D21], and 49B[D22] may be disposed between the plurality of bit lines 80B and the source layer 20B. In other words, in FIG. 2A, the plurality of bit lines 80A are located above the memory cell array 5A with the source layer 20A below, and in FIG. 2B, the source layer 20B is located above the memory cell array 5B with the plurality of bit lines 80B below. In an embodiment, the drain select lines 49B[D11], 49B[D12], 49B[D21], and 49B[D22] may include two first drain select lines 49B[D11] and 49B[D21] and two second drain select lines 49B[D12] and 49B[D22]. The two first drain select lines 49B[D11] and 49B[D21] may include a first drain select line 49B[D11] of a first level and a first drain select line 49B[D21] of a second level, which are spaced apart from each other in the third direction D3. The two second drain select lines 49B[D12] and 49B[D22] may include a second drain select line 49B[D12] of the first level and a second drain select line 49B[D22] of the second level, which are spaced apart from each other in the third direction D3. The first drain select line 49B[D11] of the first level and the second drain select line 49B[D12] of the first level may be spaced apart from each other in the first direction D1. The first drain select line 49B[D21] of the second level and the second drain select line 49B[D22] of the second level may be spaced apart from each other in the first direction D1.

As illustrated in FIG. 2B, the source select lines 49B[S31], 49B[S32], 49B[S41], and 49B[S42] may be disposed between the drain select lines 49B[D11], 49B[D12], 49B[D21], and 49B[D22] and the source layer 20B. The source select lines 49B[S31], 49B[S32], 49B[S41], and 49B[S42] may include at least one first source select line and at least one second source select line. In an embodiment, the source select lines 49B[S31], 49B[S32], 49B[S41], and 49B[S42] may include two first source select lines 49B[S31] and 49B[S41] and two second source select lines 49B[S32] and 49B[S42]. The two first source select lines 49B[S31] and 49B[S41] may include a first source select line 49B[S31] of a third level and a first source select line 49B[S41] of a fourth level, which are spaced apart from each other in the third direction D3. The two second source select lines 49B[S32] and 49B[S42] may include a second source select line 49B[S32] of the third level and a second source select line 49B[S42] of the fourth level, which are spaced apart from each other in the third direction D3. The first source select line 49B[S31] of the third level and the second source select line 49B[S32] of the third level may be spaced apart from each other in the first direction D1. The first source select line 49B[S41] of the fourth level and the second source select line 49B[S42] of the fourth level may be spaced apart from each other in the first direction D1.

In similar fashion as described with reference to FIG. 2A, the channel structures 60B1 and 60B2 may include a first channel structure 60B1 and a second channel structure 60B2, which can be simultaneously controlled by each bit line 80B. In similar fashion as described with reference to FIG. 2A, the channel structures 60B1 and 60B2 may be connected to the bit line 80B via contact structures (not shown).

Figure 3A:
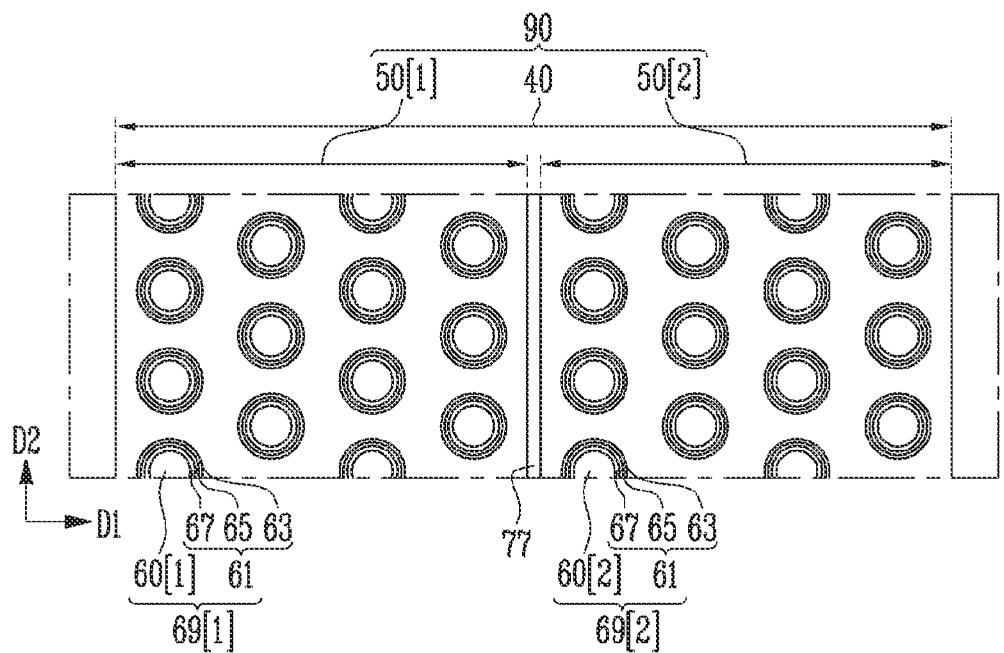
FIG. 3A is a view illustrating a memory cell array of a semiconductor memory device in accordance with an embodiment of the present disclosure.

FIG. 3A is a view illustrating a memory cell array of a semiconductor memory device in accordance with an embodiment of the present disclosure.

Referring to FIG. 3A, the gate stack structure 90 may surround a first channel structure 60[1] and a second channel structure 60[2]. A memory layer 61 may be disposed between the gate stack structure 90 and each of the first channel structure 60[1] and the second channel structure 60[2].

The memory layer 61 may include a tunnel insulating layer 67 surrounding each of the first channel structure 60[1] and the second channel structure 60[2], a data storage layer 65 surrounding the tunnel insulating layer 67, and a first blocking insulating layer 63 surrounding the data storage layer 65. The data storage layer 65 may be formed as a material layer capable of storing data. In an embodiment, the data storage layer 65 may be formed as a material layer capable of storing data changed using Fowler-Nordheim tunneling. The material layer may include a nitride layer in which charges may be trapped. The first blocking insulating layer 63 may include an oxide layer capable of blocking charges. The tunnel insulating layer 67 may be formed as a silicon oxide layer through which charges can tunnel. However, the use of nitride, oxide, and silicon oxide layers are examples and those layers are not limited thereto.

The first channel structure 60[1] and the memory layer 61 surrounding the first channel structure 60[1] may constitute a first cell pillar 69[1]. The second channel structure 60[2] and the memory layer 61 surrounding the second channel structure 60[2] may constitute a second cell pillar 69[2]. A plurality of first cell pillars 69[1] and a plurality of second cell pillars 69[2] may penetrate the gate stack structure 90. The plurality of first cell pillars 69[1] and the plurality of second cell pillars 69[2] may be variously arranged on a plane extending in the first direction D1 and the second direction D2. In an embodiment, the first cell pillars 69[1] and the second cell pillars 69[2] may constitute a zigzag arrangement so as to improve the arrangement density of memory cell strings.

The gate stack structure 90 may include a first select stack structure 50[1], a second select stack structure 50[2], and a word line stack structure 40.

The first select stack structure 50[1] and the second select stack structure 50[2] may be arranged to be spaced apart from each other in the first direction D1. Each of the first select stack structure 50[1] and the second select stack structure 50[2] may extend in the second direction D2. In an embodiment, the first select stack structure 50[1] may include the first drain select lines 49A[D31] and 49A[D41] shown in FIG. 2A, and the second select stack structure 50[2] may include the second drain select lines 49A[D32] and 49A[D42] shown in FIG. 2A. In another embodiment, the first select stack structure 50[1] may include the first drain select lines 49B[D11] and 49B[D21] shown in FIG. 2B, and the second select stack structure 50[2] may include the second drain select lines 49B[D12] and 49B[D22] shown in FIG. 2B.

The first select stack structure 50[1] and the second select stack structure 50[2] may be spaced apart from each other by an isolation insulating layer 77. The isolation insulating layer 77, the first select stack structure 50[1], and the second select stack structure 50[2] may overlap with the word line stack structure 40.

Figure 3B:
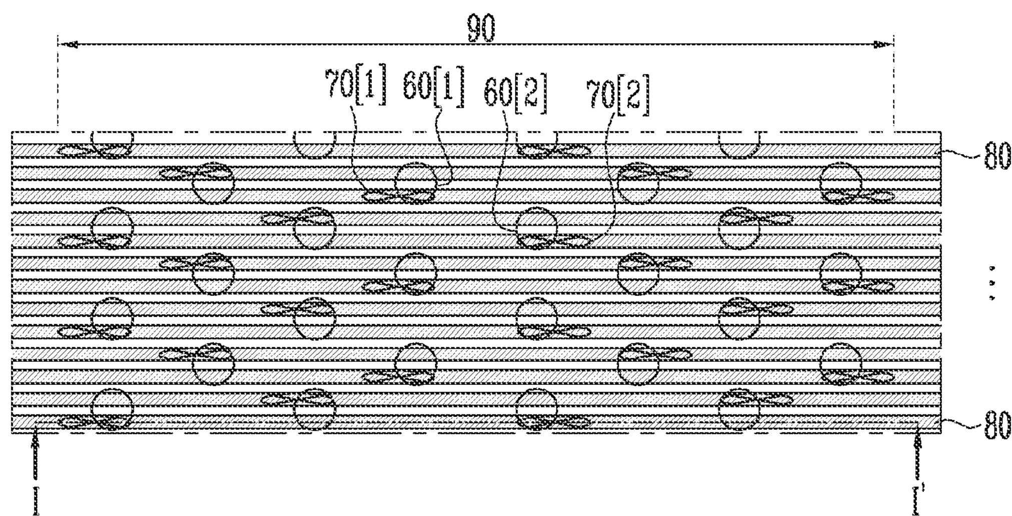
FIG. 3B is a view illustrating an embodiment of bit lines and contact structures, which are connected to first channel structures and second channel structures, which are shown in FIG. 3A.

FIG. 3B is a view illustrating an embodiment of bit lines and contact structures, which are connected to the first channel structures and the second channel structures, which are shown in FIG. 3A.

Referring to FIG. 3B, the bit lines 80 may overlap with the gate stack structure 90. Each of the bit lines 80 may be simultaneously connected to one first channel structure 60[1] and one second channel structure 60[2] via a pair of first and second contact structures 70[1] and 70[2]. In an embodiment, the bit lines 80 may include the bit lines 80A shown in FIG. 2A. In another embodiment, the bit lines 80 may include the bit lines 80B shown in FIG. 2B.

Figure 4:
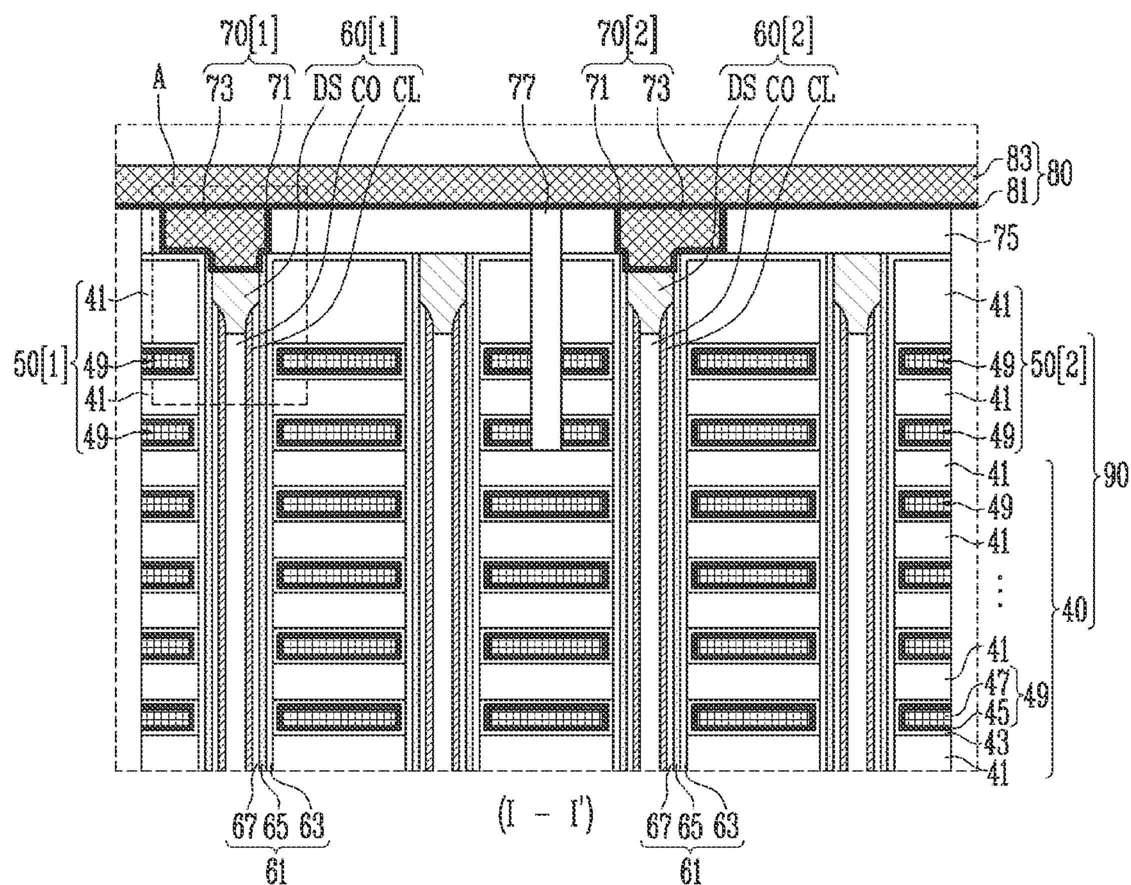
FIG. 4 is a sectional view illustrating a partial region of the semiconductor memory device taken along line I-I' shown in FIG. 3B.

FIG. 4 is a sectional view illustrating a partial region of the semiconductor memory device taken along line I-I' shown in FIG. 3B. In an embodiment, the structure shown in FIG. 4 may be applied to the semiconductor memory device 1A shown in FIG. 2A. In another embodiment, the structure shown in FIG. 4 may be vertically reversed to be applied to the semiconductor memory device 1B shown in FIG. 2B.

Referring to FIG. 4, the semiconductor memory device may include the gate stack structure 90, the first channel structure 60[1], the second channel structure 60[2], the memory layer 61, and the isolation insulating layer 77, which are described with reference to FIG. 3A. Also, the semiconductor memory device may include the first contact structure 70[1], the second contact structure 70[2] as shown in FIG. 4, and the bit line 80.

The gate stack structure 90 may include interlayer insulating layers 41 and conductive patterns 49, which are alternately stacked as shown in FIG. 4. In an embodiment, each of the conductive patterns 49 may include a conductive barrier layer 45 and a metal layer 47. The conductive barrier layer 45 may be disposed between the memory layer 61 and the metal layer 47. The conductive barrier layer 45 may extend between each of the interlayer insulating layers 41 and the metal layer 47. However, the embodiment of the present disclosure is not limited thereto, and the conductive patterns 49 may include at least one of a metal layer, a metal silicide layer, and a doped silicon layer.

The conductive patterns 49 and the interlayer insulating layers 41 may constitute the word line stack structure 40, the first select stack structure 50[1], and the second select stack structure 50[2]. The first select stack structure 50[1] and the second select stack structure 50[2] may be disposed between the word line stack structure 40 and the bit line 80. The first select stack structure 50[1] and the second select stack structure 50[2] may be isolated from each other at the same level. The first select stack structure 50[1] may be spaced apart from the second select stack structure 50[2] by the isolation insulating layer 77. The isolation insulating layer 77 does not penetrate the word line stack structure 40, but may overlap with the word line stack structure 40 as illustrated in FIG. 4. The word line stack structure 40 may continuously extend not only to overlap with the first select stack structure 50[1] but also to overlap with the second select stack structure 50[2].

Conductive patterns constituting the first select stack structure 50[1] among the conductive patterns may be used as first drain select lines. Conductive patterns constituting the second select stack structure 50[2] among the conductive patterns may be used as second drain select lines. Conductive patterns constituting the word line stack structure 40 among the conductive patterns 49 may be used as word lines.

The first channel structure 60[1] and the second channel structure 60[2] may penetrate the gate stack structure 90. Each of the conductive patterns 49 of the first select stack structure 50[1] may surround the first channel structure 60[1], and each of the conductive patterns 49 of the second select stack structure 50[2] may surround the second channel structure 60[2]. Each of the conductive patterns 49 of the word line stack structure 40 may extend not only to surround the first channel structure 60[1] but also to surround the second channel structure 60[2].

Each of the first channel structure 60[1] and the second channel structure 60[2] may include a core insulating layer CO, a channel layer CL, and a doped semiconductor pattern DS. The core insulating layer CO and the doped semiconductor pattern DS may be disposed in a central region of each of the first channel structure 60[1] and the second channel structure 60[2]. The core insulating layer CO and the doped semiconductor pattern DS may be aligned in a stacking direction of the conductive patterns 49 and the interlayer insulating layer 41. The core insulating layer CO may extend in the stacking direction of the conductive patterns 49 and the interlayer insulating layer 41. The doped semiconductor pattern DS may be disposed closer to the bit line 80 than the core insulating layer CO. The doped semiconductor pattern DS may include at least one of an n-type impurity and a p-type impurity. In an embodiment, the doped semiconductor pattern DS may be made, for example, of n-type doped silicon. The channel layer CL surrounds a sidewall of the core insulating layer CO, and extends toward the bit line 80 to be in contact with the doped semiconductor pattern DS. The channel layer CL may include a semiconductor layer capable of providing a channel region. In an embodiment, the channel layer CL may include silicon.

The first contact structure 70[1] may be in contact with the doped semiconductor pattern DS of the first channel structure 60[1], and the second contact structure 70[2] may be in contact with the doped semiconductor pattern DS of the second channel structure 60[2]. Each of the first contact structure 70[1] and the second contact structure 70[2] may extend onto the gate stack structure 90. More specifically, the first contact structure 70[1] may extend onto a top surface of the first select stack structure 50[1], which faces the bit line 80. In addition, the second contact structure 70[2] may extend onto a top surface of the second select stack structure 50[2], which faces the bit line 80. The first contact structure 70[1] and the second contact structure 70[2] may extend in a direction moving away from the isolation insulating layer 77 on the gate stack structure 90. In other words, the first contact structure 70[1] and the second contact structure 70[2] may include portions extending in directions opposite to each other to parallel to the gate stack structure 90.

An insulating layer 75 may be disposed between the gate stack structure 90 and the bit line 80. The first contact structure 70[1] and the second contact structure 70[2] may be insulated from each other by the insulating layer 75. The insulating layer 75 may include a silicon oxide layer.

Each of the first contact structure 70[1] and the second contact structure 70[2] may be formed of a conductive material having an etch selectivity different from that of the doped semiconductor pattern DS. In an embodiment, each of the first contact structure 70[1] and the second contact structure 70[2] may include a metal layer 73 and a conductive liner layer 71. The metal layer 73 may be disposed in a central region of a contact structure 70[1] or 70[2] corresponding to the metal layer 73. The conductive liner layer 71 may be in contact with a surface of the metal layer 73, which faces the doped semiconductor pattern DS and the gate stack structure 90. The conductive liner layer 71 may extend along a sidewall of the metal layer 73, which faces the insulating layer 75. In other words, the conductive liner layer 71 may be disposed between the metal layer 73 and each of the doped semiconductor layer DS, the gate stack structure 90, and the insulating layer 75. The conductive liner layer 71 may provide an ohmic contact between the metal layer 73 and the doped semiconductor pattern DS, and may include a material which may serve as a barrier for preventing diffusion of metal. In an embodiment, for example, the conductive liner layer 71 may, for example, include titanium (Ti) and titanium nitride (TiN), include titanium nitride (TiN), or include titanium silicide (TiSi).

The memory layer 61 may surround a sidewall of each of the first channel structure 60[1] and the second channel structure 60[2]. The memory layer 61 may include a tunnel insulating layer 67, a data storage layer 65, and a first blocking insulating layer 63 as described with reference to FIG. 3A. The tunnel insulating layer 67 may be disposed between the gate stack structure 90 and each of the first channel structure 60[1] and the second channel structure 60[2]. The data storage layer 65 may be disposed between the tunnel insulating layer 67 and the gate stack structure 90. The first blocking insulating layer 63 may be disposed between the data storage layer 65 and the gate stack structure 90. The first blocking insulating layer 63 may extend between the gate stack structure 90 and each of the first contact structure 70[1] and the second contact structure 70[2]. The first blocking insulating layer 63 may extend along a top surface of the gate stack structure 90, which faces the bit line 80. More specifically, the first blocking insulating layer 63 may extend along a top surface of the first select stack structure 50[1], which faces the bit line 80, and a top surface of the second select stack structure 50[2], which faces the bit line 80.

The isolation insulating layer 77 may extend to penetrate the interlayer insulating layer 41, the insulating layer 75 and the first blocking insulating layer 63.

A second blocking insulating layer 43 may be disposed between each of the conductive patterns 49 of the gate stack structure 90 and the interlayer insulating layer 41. More specifically, the second blocking insulating layer 43 may be disposed between each of the conductive patterns 49 and the first blocking insulating layer 63. The second blocking insulating layer 43 may be configured as an insulating layer having a dielectric constant higher than that of the first blocking insulating layer 63. In an embodiment, the first blocking insulating layer 63 may include a silicon oxide layer, and the second blocking insulating layer 43 may include a metal oxide layer such as an aluminum oxide layer or a hafnium oxide layer. The second blocking insulating layer 43 may extend between the interlayer insulating layers 41 and the conductive patterns 49.

The bit line 80 may be disposed on the insulating layer 75. The bit line 80 may be in contact with the first contact structure 70[1] and the second contact structure 70[2]. The bit line 80 may be formed of various conductive materials. In an embodiment, the bit line 80 may include a conductive barrier layer 81 and a metal layer 83. The conductive barrier layer 81 may be disposed between the metal layer 83 and the insulating layer 75, and may extend between the metal layer 83 and each of the first contact structure 70[1] and the second contact structure 70[2].

Figure 5:
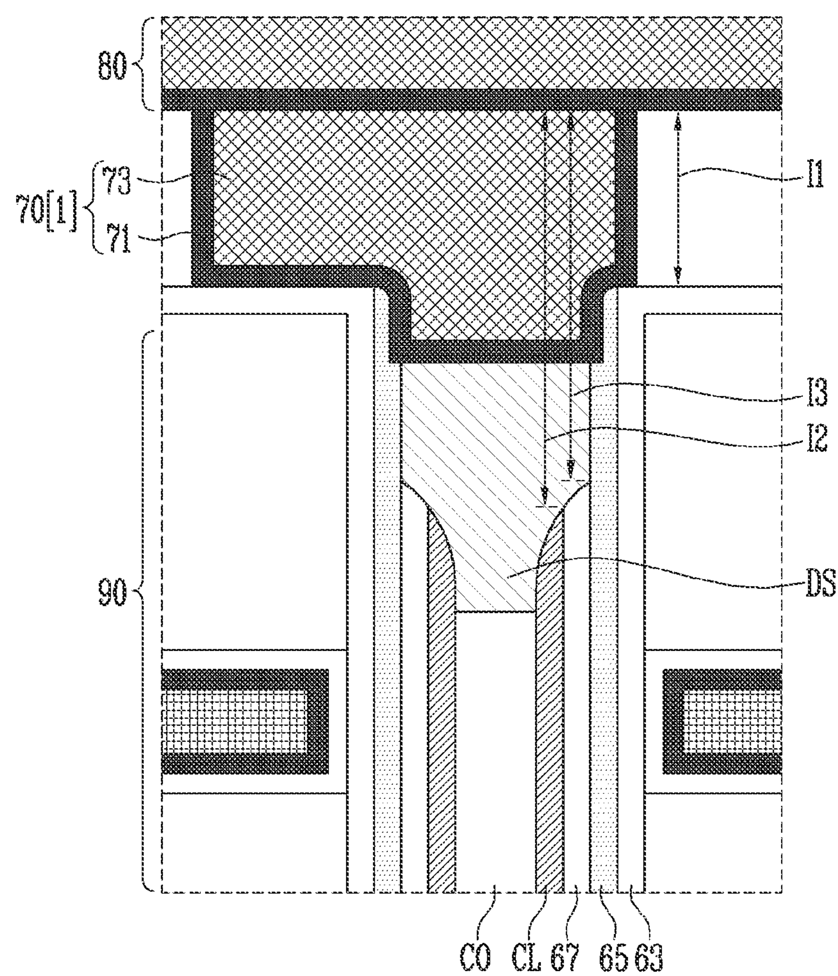
FIG. 5 is an enlarged sectional view of region A shown in FIG. 4.

FIG. 5 is an enlarged sectional view of region A shown in FIG. 4.

Referring to FIG. 5, the doped semiconductor pattern DS may extend between the channel layer CL and a contact structure (e.g., 70[1]) corresponding to the doped semiconductor pattern DS. The doped semiconductor pattern DS may extend between the tunnel insulating layer 67 and the contact structure 70[1] corresponding to the doped semiconductor pattern DS. Each of the data storage layer 65 and the first blocking insulating layer 63 may farther protrude toward the bit line 80 than each of the channel layer CL and the tunnel insulating layer 67. The doped semiconductor pattern DS may extend toward the gate stack structure 90 to be in contact with the data storage layer 65.

In accordance with an embodiment of the present disclosure, a distance I2 between the bit line 80 and the channel layer CL may be defined greater than that I1 between the first blocking insulating layer 63 and the bit line 80. In addition, a distance I3 between the bit line 80 and the tunnel insulating layer 67 may be defined greater than that I1 between the first blocking insulating layer 63 and the bit line 80.

Hereinafter, a manufacturing method capable of providing the contact structure (70[1] or 70[2] shown in FIG. 4) which is stably in contact with the doped semiconductor pattern DS shown in FIG. 4 even when a separate etch stop layer is not formed between the bit line 80 and the gate stack structure 90 will be described.

Figure 6A:
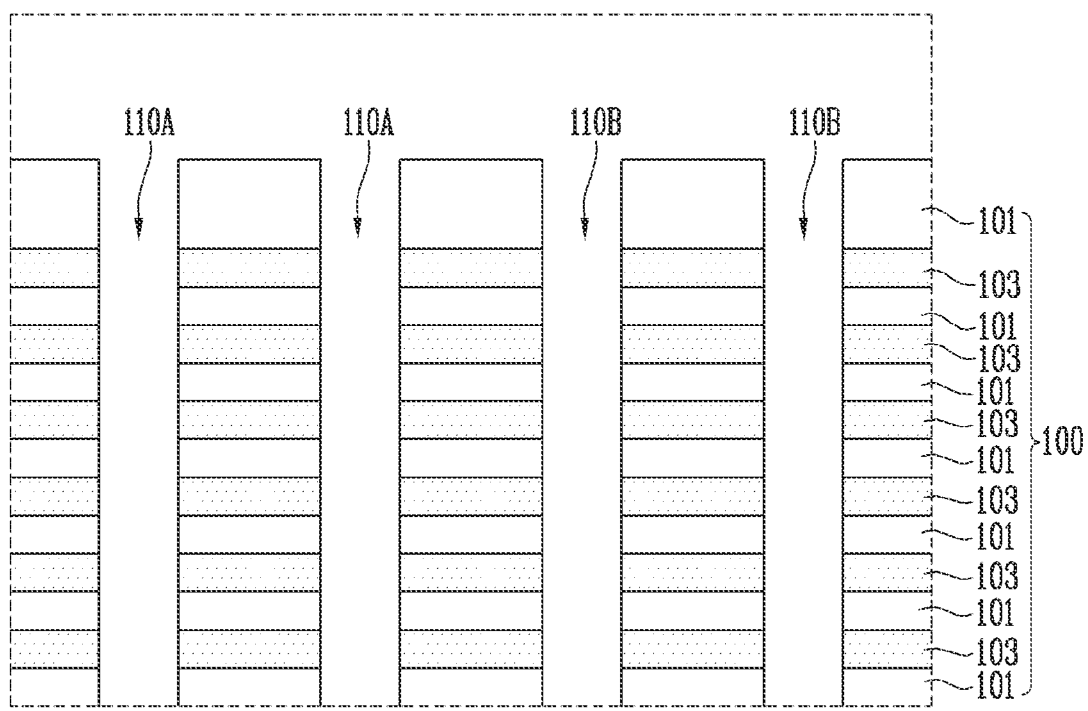
FIGS. 6A, 6B, and 6C are sectional views illustrating an embodiment of a method of forming a stack structure penetrated by a blocking insulating layer and pillar structures.
Figure 6B:
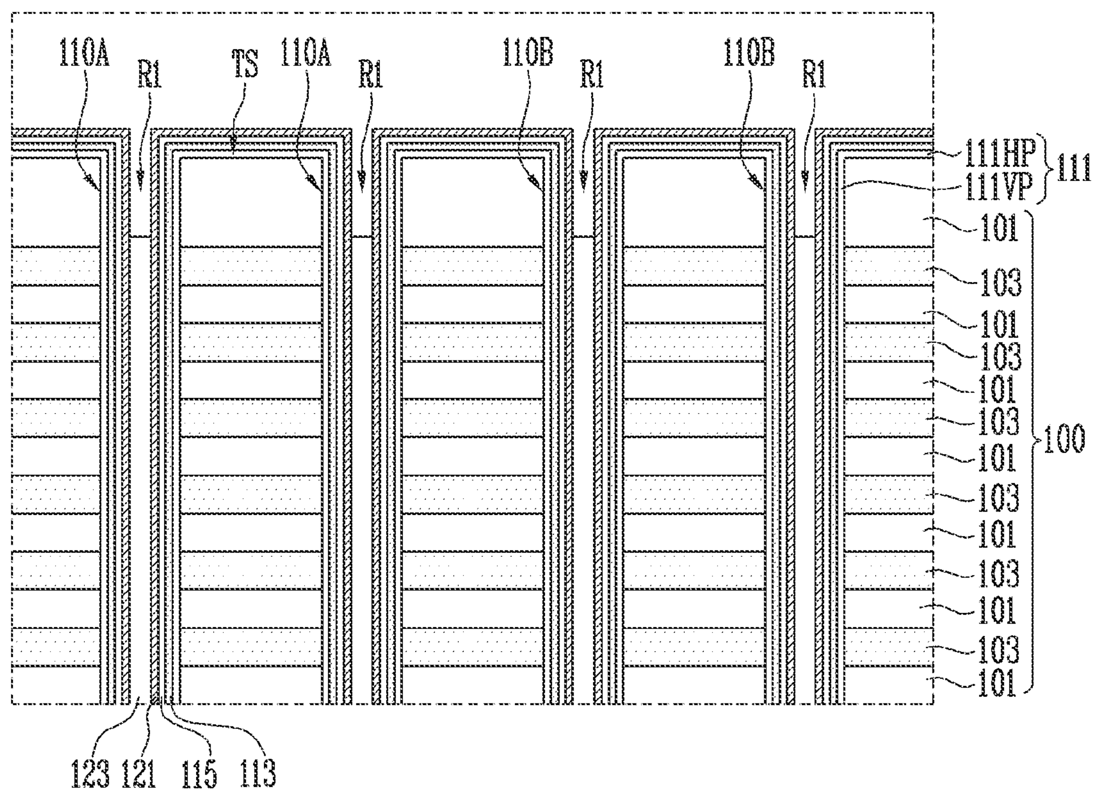
Figure 6C:
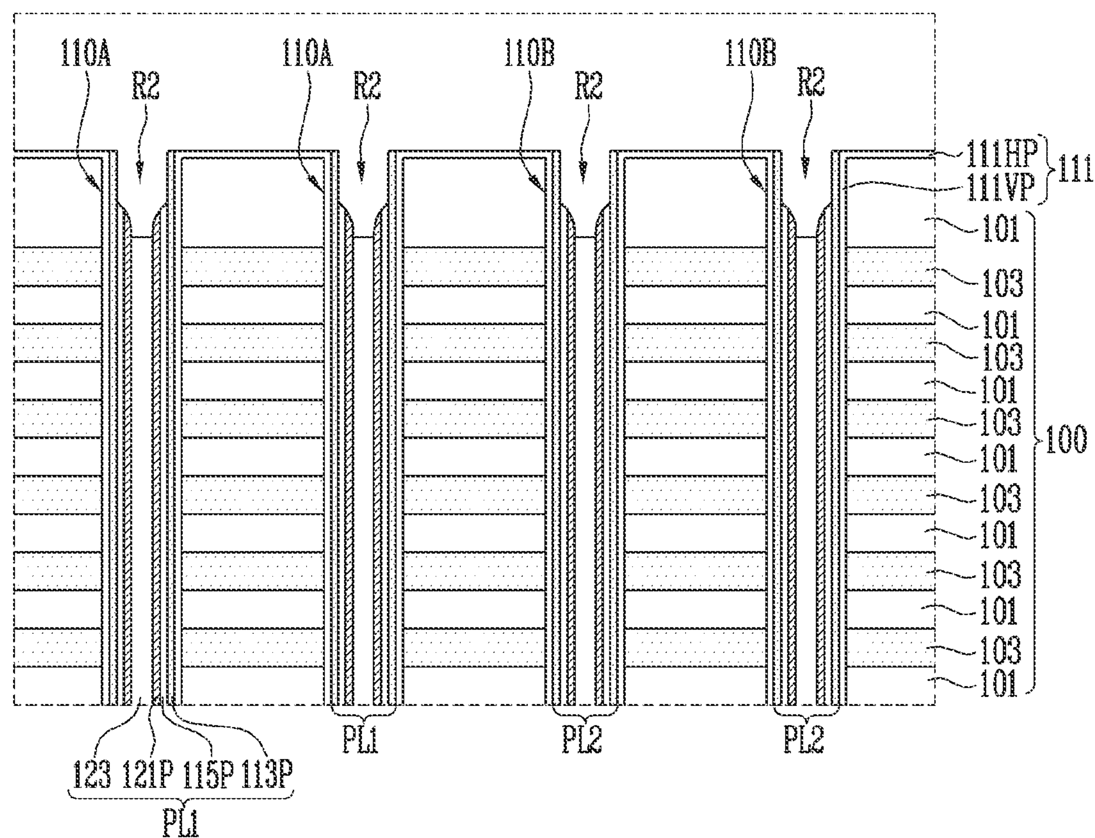

FIGS. 6A, 6B, and 6C are sectional views illustrating an embodiment of a method of forming a stack structure penetrated by a blocking insulating layer and pillar structures.

Referring to FIG. 6A, at least one first channel hole 110A and at least one second channel hole 110B may be formed by etching a stack structure 100 through an etching process using a photolithography process. The stack structure 100 may include first material layers 101 and second material layers 103, which are alternately stacked. The first channel hole 110A and the second channel hole 110B may penetrate the stack structure 100 in a stacking direction of the first material layers 101 and the second material layers 103.

In an embodiment, the first material layers 101 may be interlayer insulating layers, and the second material layers 103 may be formed of a material selected from materials having an etch selectivity with respect to the interlayer insulating layers. In an embodiment, each of the first material layers may be formed of a silicon oxide layer, and each of the second material layers 103 may be formed of a silicon nitride layer having an etch selectivity with respect to the silicon oxide layer. In another embodiment, the first material layers 101 may be interlayered insulating layers, and the second material layers 103 may be conductive layers.

Referring to FIG. 6B, a first blocking insulating layer 111 may be formed on a sidewall of each of the first channel hole 110A and the second channel hole 110B. The first blocking insulating layer 111 may extend along a top surface TS of the stack structure 100. The first blocking insulating layer 111 may include an insulating layer which has an etch selectivity on a doped semiconductor layer and can block movement of charges. In an embodiment, for example, the first blocking insulating layer 111 may include a silicon oxide layer.

The first blocking insulating layer 111 may include a vertical part 111VP and a horizontal part 111HP. The vertical part 111VP of the first blocking insulating layer 111 may be defined as a part disposed on the sidewall of each of the first channel hole 110A and the second channel hole 110B. The horizontal part 111HP of the first blocking insulating layer 111 may be defined as a part extending along the top surface TS of the stack structure 100.

Subsequently, a data storage layer 113, a tunnel insulating layer 115, and a channel layer 121 may be sequentially stacked on the first blocking insulating layer 111. The data storage layer 113 may include a nitride layer in which charges can be trapped, and the tunnel insulating layer 115 may include an oxide layer through which charges may tunnel. The channel layer 121 may include a semiconductor layer used as a channel region.

Subsequently, a core insulating layer 123 may be formed in a central region of each of the first channel hole 110A and the second channel hole 110B, which is opened by the channel layer 121. Subsequently, a portion of the core insulating layer 123 may be recessed. As a result, as illustrated in FIG. 6B, an upper end portion R1 of each of the first channel hole 110A and the second channel hole 110B may be opened.

Referring to FIG. 6C, a portion of the channel layer 121 shown in FIG. 6B and a portion of the tunnel insulating layer 115 shown in FIG. 6B may be sequentially removed such that the data storage layer 113 shown in FIG. 6B is exposed through the upper end portion R1 of each of the first channel hole 110A and the second channel hole 110B shown in FIG. 6B. Accordingly, an upper end portion R2 of each of the first channel hole 110A and the second channel hole 110B may be opened with a width wider than that of the upper end portion R1 shown in FIG. 6B.

The tunnel insulating layer 115 shown in FIG. 6B may serve as an etch stop layer during an etching process of removing the portion of the channel layer 121 shown in FIG. 6B. The data storage layer 113 shown in FIG. 6B may serve as an etch stop layer during an etching process of removing a portion of the tunnel insulating layer 115 shown in FIG. 6B. Hereinafter, the channel layer which is not removed but remains is defined as a channel pattern 121P, and the tunnel insulating layer which is not removed but remains is defined as a tunnel insulating pattern 115P.

Each of the channel pattern 121P and the tunnel insulating pattern 115P may remain between the core insulating layer 123 and the stack structure 100. Each of the channel pattern 121P and the tunnel insulating pattern 115P may include an end portion disposed in each of the first channel hole 110A and the second channel hole 110B.

Subsequently, a portion of the data storage layer 113 shown in FIG. 6B may be removed through a dry etching process such that the horizontal part 111HP of the first blocking insulating layer 111 can be exposed. Hereinafter, the data storage layer which is not removed but remains is defined as a data storage pattern 113P. The data storage pattern 113P remains to farther protrude than the channel pattern 121P and the tunnel insulating pattern 115P, to be exposed by the upper end portion R2 of each of the first channel hole 110A and the second channel hole 110B.

The core insulating layer 123, the channel pattern 121P, the tunnel insulating pattern 115P, and the data storage pattern 113P, which remain in the first channel hole 110A, may constitute a first pillar structure PL1. The core insulating layer 123, the channel pattern 121P, the tunnel insulating pattern 115P, and the data storage pattern 113P, which remain in the second channel hole 110B, may constitute a second pillar structure PL2. In accordance with an embodiment of the present disclosure, the first pillar structure PL1 may be defined to open the upper end portion R2 of the first channel hole 110A, and the second pillar structure PL2 may be defined to open the upper end portion R2 of the second channel hole 110B.

Figure 7A:
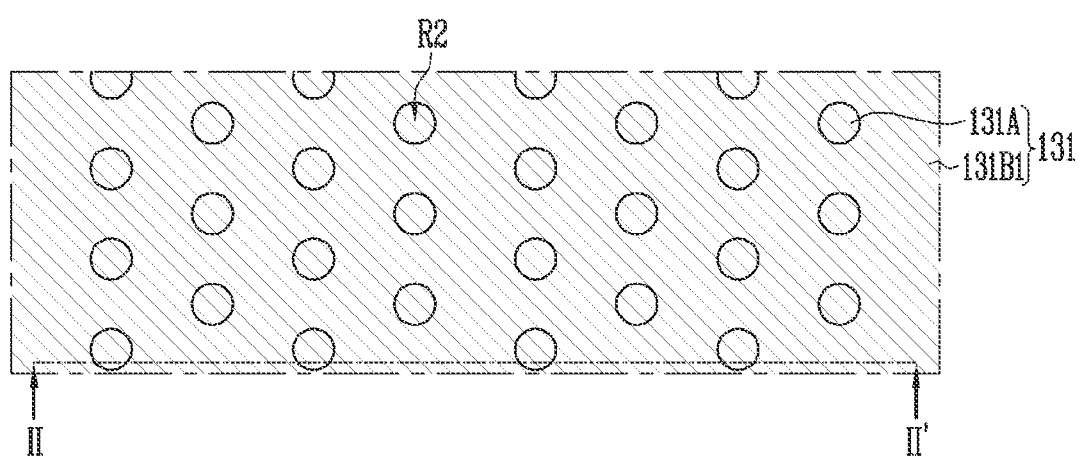
FIG. 7A is a plan view illustrating an embodiment of a method of forming a doped semiconductor layer.
Figure 7B:
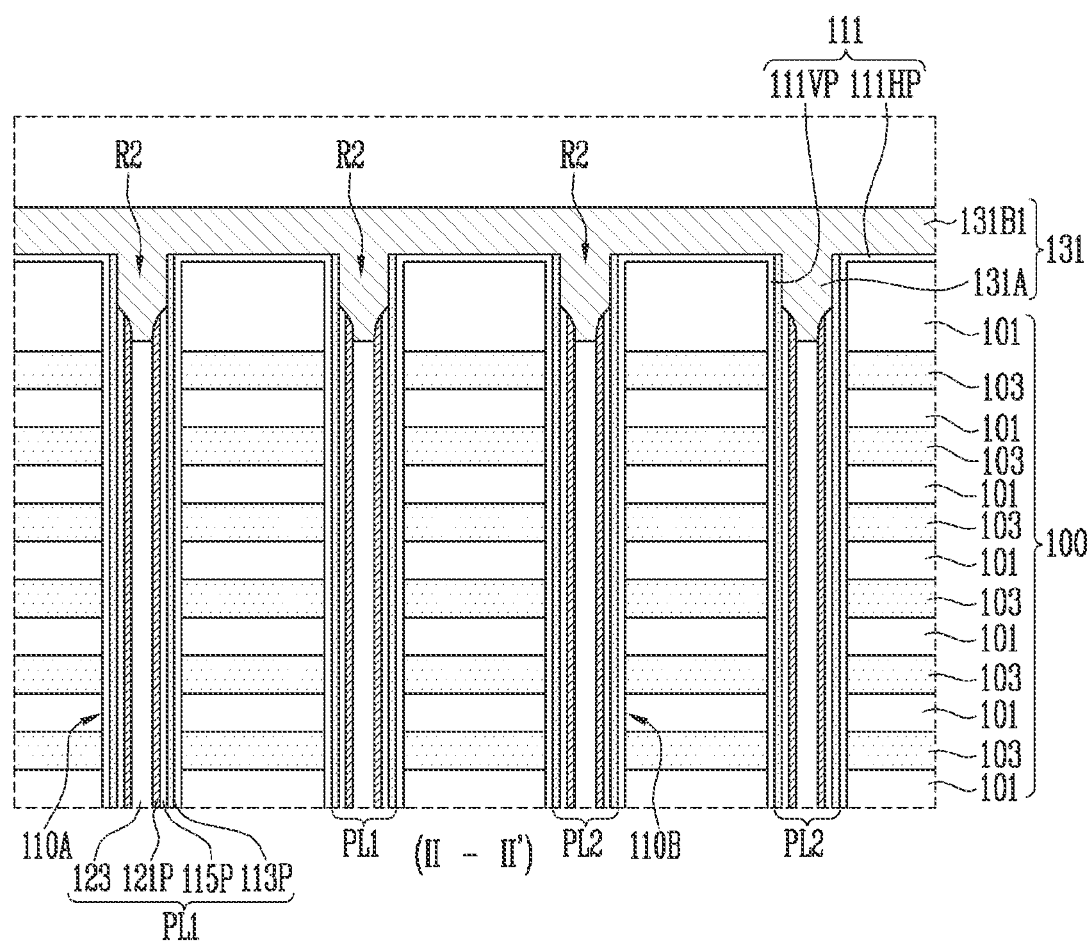
FIG. 7B is a sectional view taken along line II-II' shown in FIG. 7A.

FIG. 7A is a plan view illustrating an embodiment of a method of forming a doped semiconductor layer, and FIG. 7B is a sectional view taken along line II-II' shown in FIG. 7A.

Referring to FIGS. 7A and 7B, a doped semiconductor layer 131 may be formed on the stack structure 100. The doped semiconductor layer 131 may include a first part 131A and a second part 131B1.

The first part 131A of the doped semiconductor layer 131 may fill the upper end portion R2 of each of the first channel hole 110A and the second channel hole 110B. The first part 131A of the doped semiconductor layer 131 may be in contact with the channel pattern 121P. The first part 131A of the doped semiconductor layer 131 may be surrounded by the vertical part 111VP of the first blocking insulating layer 111.

The second part 131B1 of the doped semiconductor layer 131 may extend in a direction intersecting the first part 131A from the first part 131A to overlap with the stack structure 100. The second part 131B1 of the doped semiconductor layer 131 may extend onto the horizontal part 111HP of the first blocking insulating layer 111 from the first part 131A.

Figure 8A:
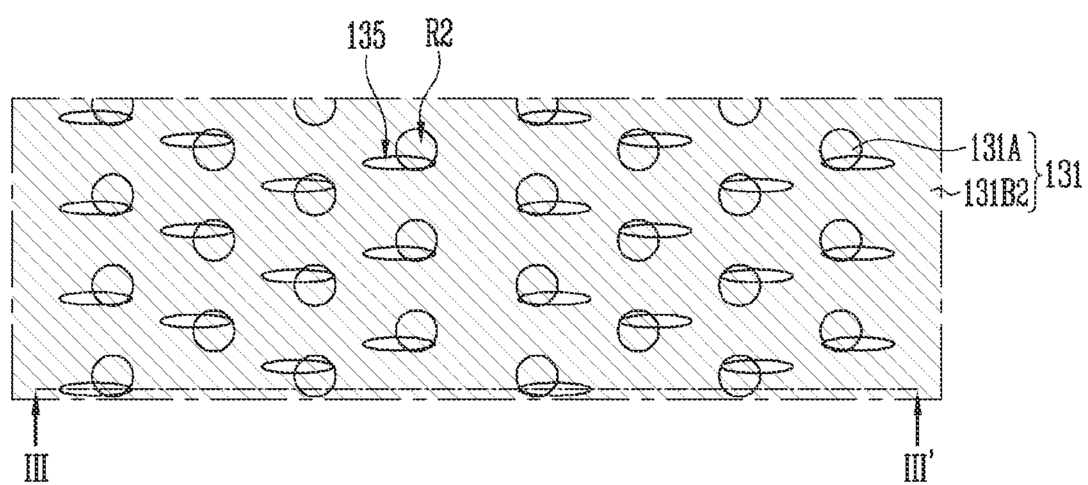
FIG. 8A is a plan view illustrating an embodiment of a method of forming contact holes.
Figure 8B:
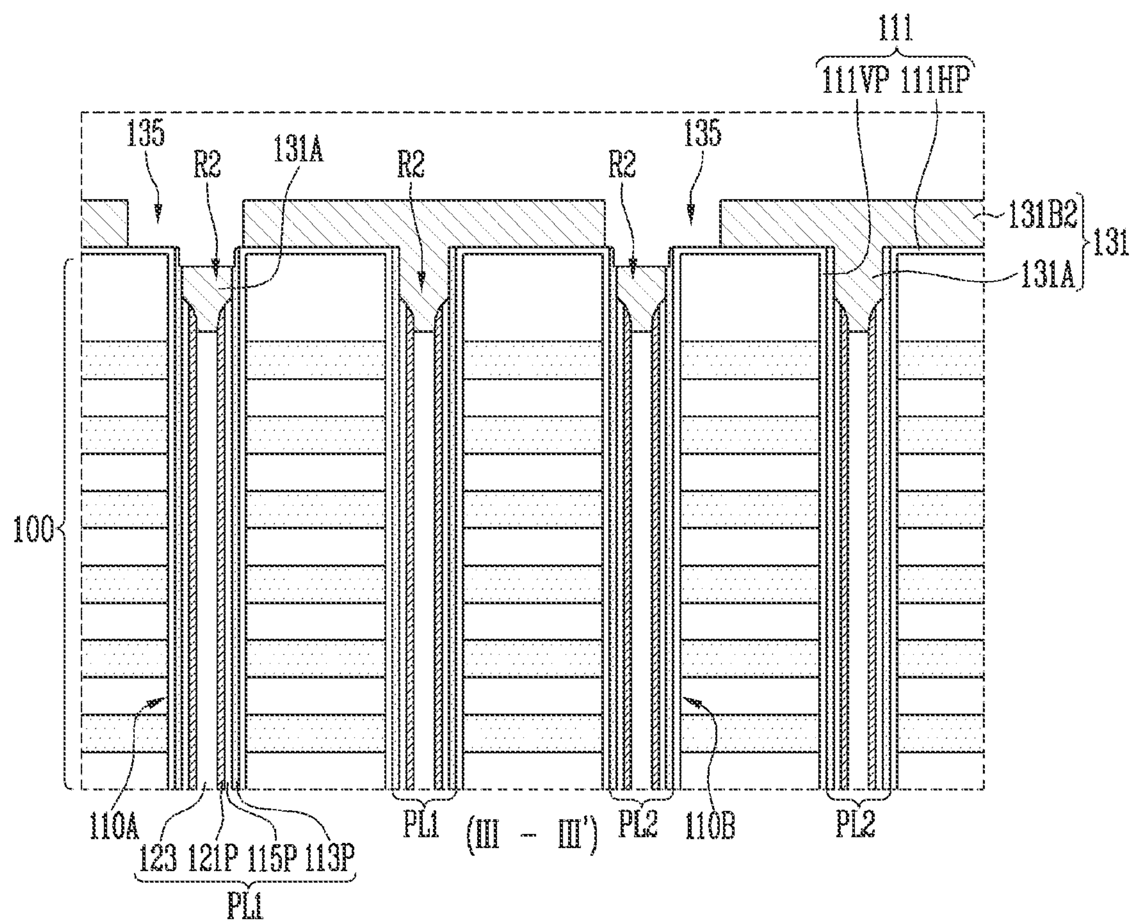
FIG. 8B is a sectional view taken along line III-III' shown in FIG. 8A.

FIG. 8A is a plan view illustrating an embodiment of a method of forming contact holes, and FIG. 8B is a sectional view taken along line III-III' shown in FIG. 8A.

Referring to FIGS. 8A and 8B, a portion of the doped semiconductor layer 131 may be etched by using a photolithography process, so that contact holes 135 overlapping with the first pillar structure PL1 and the second pillar structure PL2 may be formed. The doped semiconductor layer 131 may be etched by using an etchant which prevents damage of the first blocking insulating layer 111, and may selectively remove the doped semiconductor layer 131. In an embodiment, the doped semiconductor layer 131 may, for example, be etched by using an etchant including at least one of chlorine ($Cl_2$) and hydrogen bromide (HBr).

The contact holes 135 may extend in a direction intersecting the first pillar structure PL1 and the second pillar structure PL2 to overlap with the stack structure 100. Due to a difference in etch selectivity between the first blocking insulating layer 111 and the doped semiconductor layer 131, the first blocking insulating layer 111 may serve as an etch stop layer while the doped semiconductor layer 131 is being etched. Accordingly, in an embodiment of the present disclosure, a phenomenon in which the contact holes 135 are formed excessively deep may be mitigated or prevented.

The contact holes 135 may penetrate the second part 131B1 of the doped semiconductor layer 131 shown in FIG. 7B, and may expose the first part 131A of the doped semiconductor layer 131. The first part 131A may remain in the upper end portion R2 of each of the first channel hole 110A and the second channel hole 110B. A second part 131B2 of the doped semiconductor layer 131 may remain at the periphery of each of the contact holes 135. In other words, as illustrated in FIG. 8B, the second part 131B2 of the doped semiconductor layer 131 may define a sidewall of each of the contact holes 135.

Although not shown in the drawings, for example, when a contact hole is formed by etching an insulating layer formed on the doped semiconductor layer, there may occur a failure that the doped semiconductor layer is not exposed by the contact hole. In accordance with the embodiment of the present disclosure, because the contact holes 135 are defined by etching a portion of the doped semiconductor layer 131, an advantage of the present disclosure is that a failure that the doped semiconductor layer 131 is not opened may be blocked in advance, even when the contact holes 135 are not formed excessively deep.

Figure 9A:
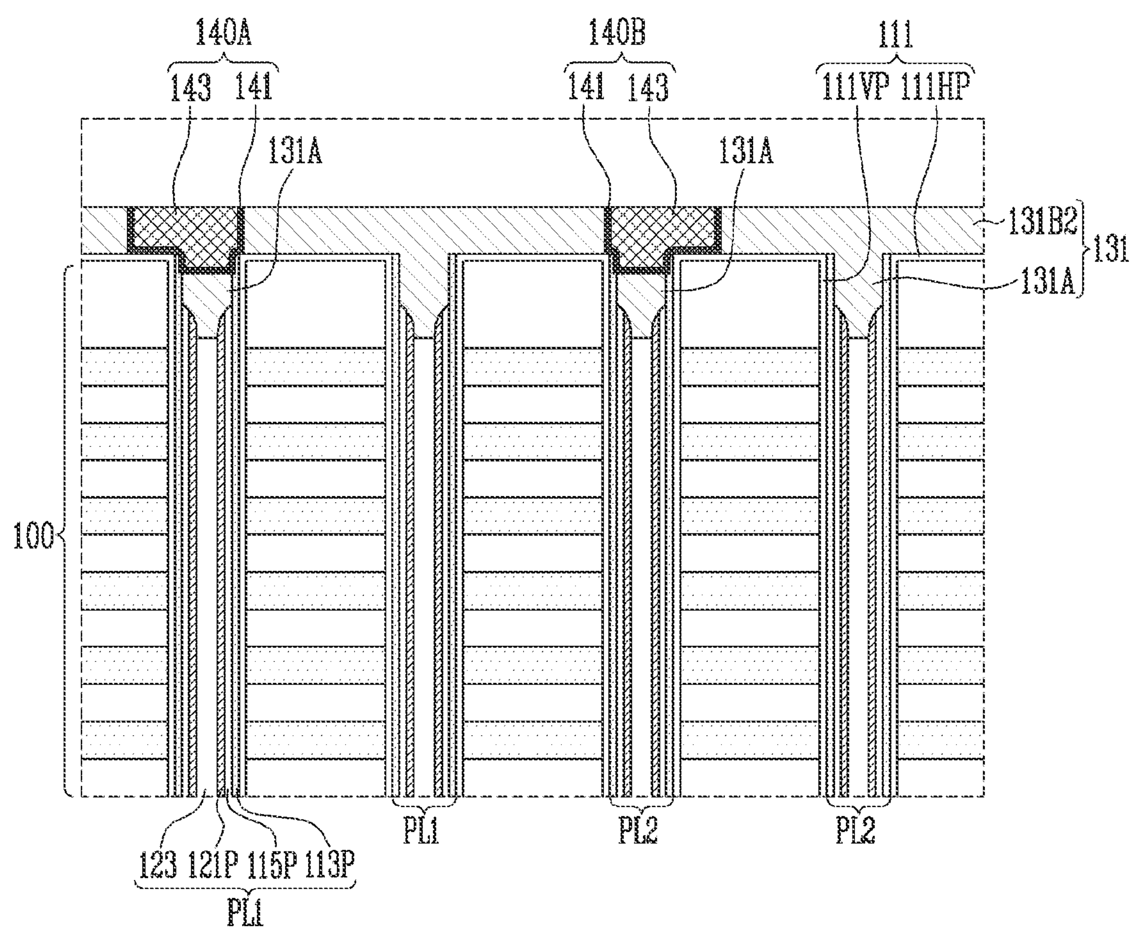
FIGS. 9A, 9B, and 9C are sectional views illustrating an embodiment of subsequent processes continued after the contact holes are formed.
Figure 9B:
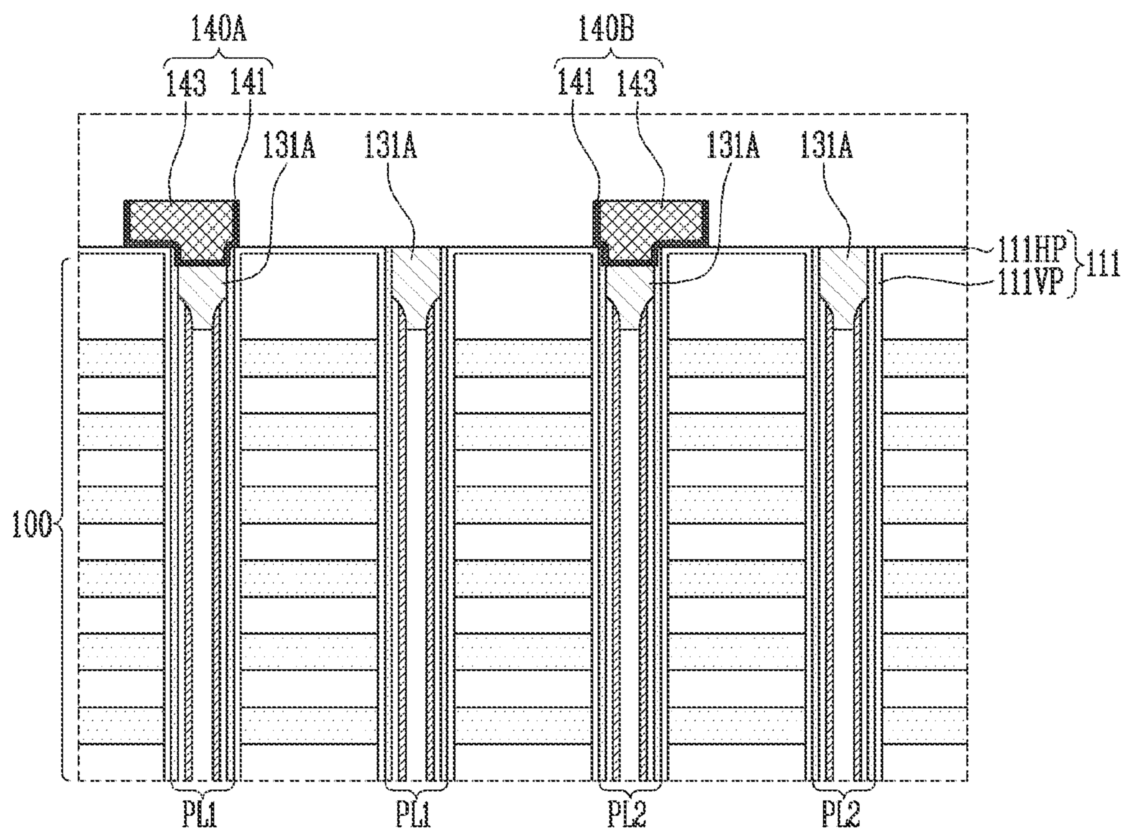
Figure 9C:
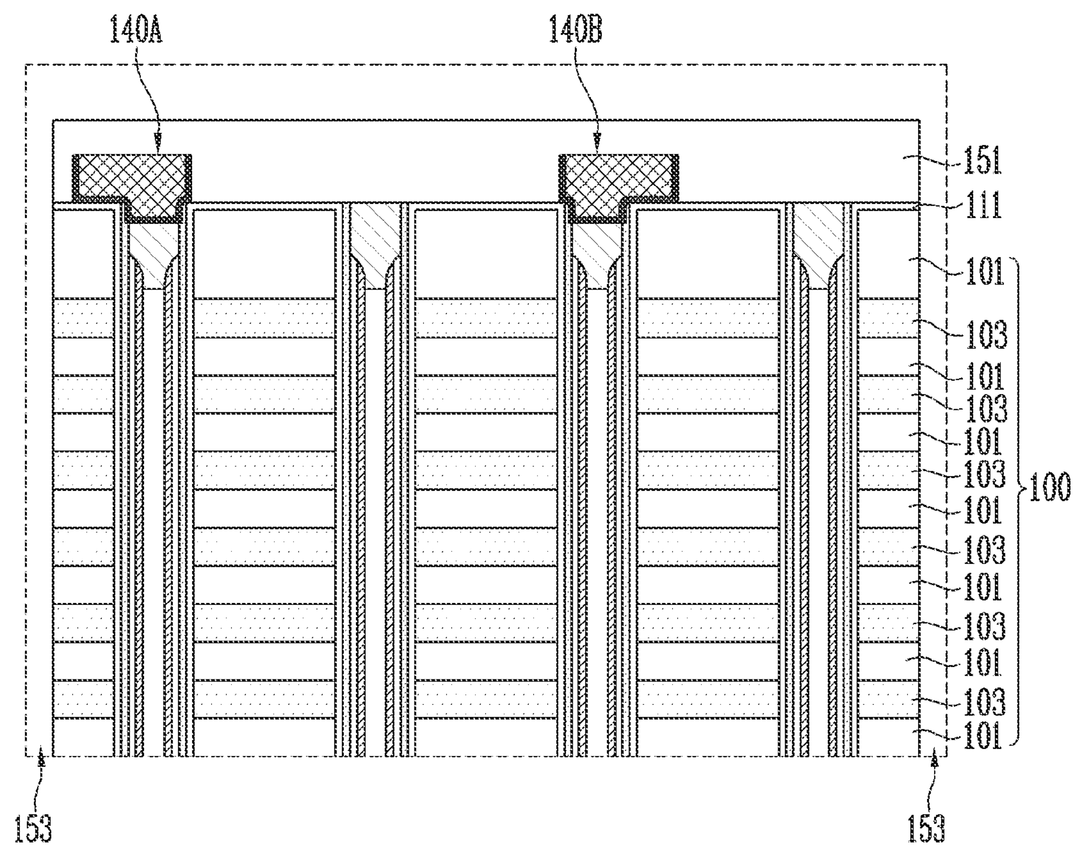

FIGS. 9A, 9B, and 9C are sectional views illustrating an embodiment of subsequent processes continued after the contact holes are formed.

Referring to FIG. 9A, the contact holes 135 may be filled with a first contact structure 140A and a second contact structure 140B. The first contact structure 140A may be in contact with the first part 131A of the doped semiconductor layer 131, which overlaps with the first pillar structure PL1, and the second contact structure 140B may be in contact with the first part 131A of the doped semiconductor layer 131, which overlaps with the second pillar structure PL2.

The process of forming the first contact structure 140A and the second contact structure 140B may include a process of filling the contact holes 135 shown in FIG. 8B with a conductive material and a process of removing a portion of the conductive material through a planarization process such that the second part 131B2 of the doped semiconductor layer 131 is exposed. The conductive material may have an etch selectivity different from that of the doped semiconductor layer 131. In an embodiment, the conductive material may include a conductive liner layer 141 and a metal layer 143.

The conductive liner layer 141 may be formed along a surface of each of the contact holes 135 shown in FIG. 8B. The conductive liner layer 141 may be in contact with the doped semiconductor layer 131. The conductive liner layer 141 may provide an ohmic contact between the metal layer 143 and the doped semiconductor layer 131, and include a material which can serve as a barrier for preventing diffusion of metal. In an embodiment, for example, the conductive liner layer 141 may include titanium (Ti) and titanium nitride (TiN), include titanium nitride (TiN), or include titanium silicide (TiSi). The metal layer 143 may be formed on the conductive liner layer 141 to fill a central region of each of the contact holes 135 shown in FIG. 8B.

Referring to FIG. 9B, the second part 131B2 of the doped semiconductor layer 131 shown in FIG. 9A may be selectively removed by using a difference in etch selectivity between the doped semiconductor layer 131 shown in FIG. 9A and each of the first contact structure 140A and the second contact structure 140B. The first blocking insulating layer 111 may serve as an etch stop layer, while the second part 131B2 of the doped semiconductor layer 131 shown in FIG. 9A is removed.

The process of removing the second part 131B2 of the doped semiconductor layer 131 shown in FIG. 9A may be performed such that the doped semiconductor layer 131 shown in FIG. 9A remains as doped semiconductor patterns overlapping with the first pillar structure PL1 and the second pillar structure PL2. Each of the doped semiconductor patterns may be configured as the first part 131A of the doped semiconductor layer.

The first contact structure 140A may include a region overlapping with the first pillar structure PL1 and a region not overlapping with the first pillar structure PL1, and the second contact structure 140B may include a region overlapping with the second pillar structure PL2 and a region not overlapping with the second pillar structure PL2. A partial region of the first part 131A of the doped semiconductor layer may not overlap with each of the first pillar structure PL1 and the second pillar structure PL2. The partial region of the first part 131A of the doped semiconductor layer may be exposed when the second part 131E32 of the doped semiconductor layer 131 shown in FIG. 9A is removed.

Referring to FIG. 9C, a first insulating layer 151 may be formed on the stack structure 100. The first insulating layer 151 may include a silicon oxide layer. The first insulating layer 151 may cover the first contact structure 140A and the second contact structure 140B, and extend onto the first blocking insulating layer 111.

Subsequently, a slit 153 may be formed, which penetrates the first insulating layer 151, the first blocking insulating layer 111, and the stack structure 100.

A subsequent process continued may vary according to properties of the first material layers 101 and the second material layers 103.

Figure 10A:
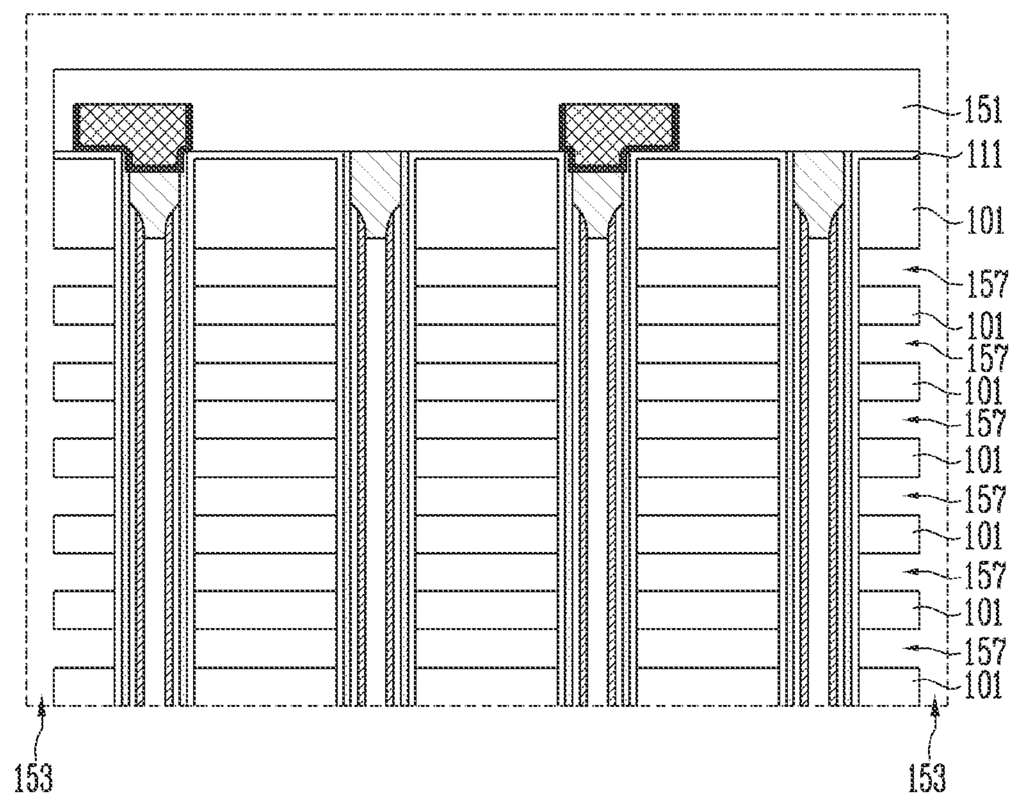
FIGS. 10A and 10B are sectional views illustrating an embodiment of a method of forming conductive patterns.
Figure 10B:
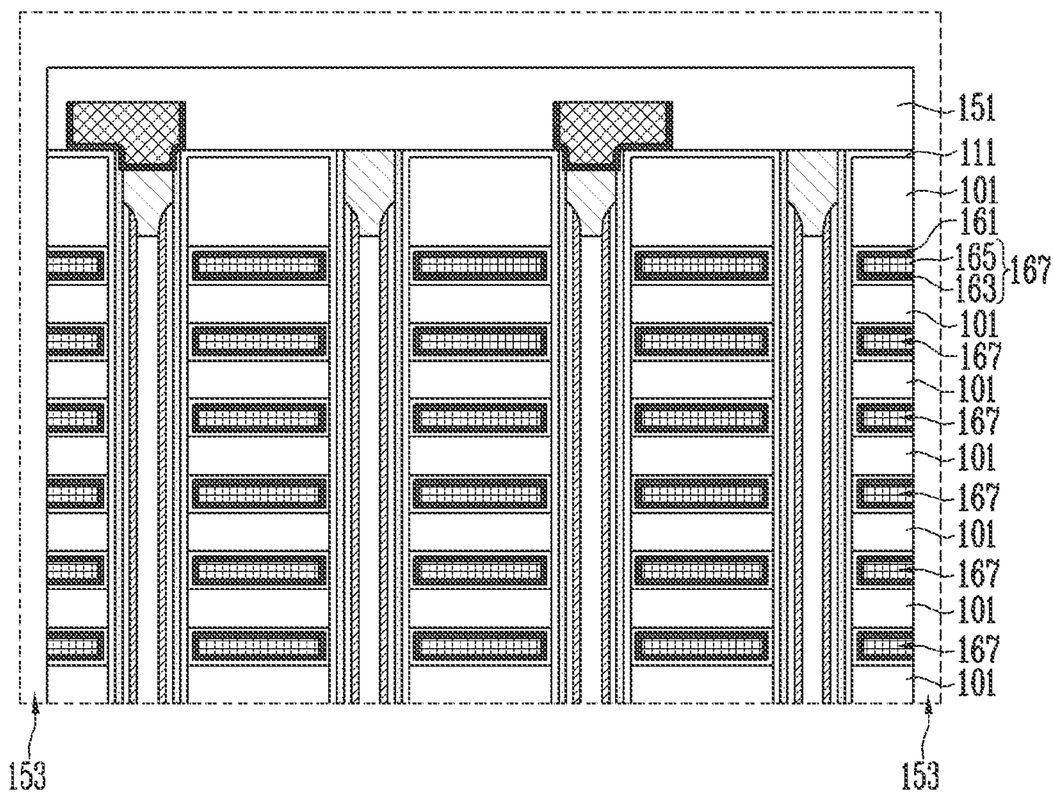

FIGS. 10A and 10B are sectional views illustrating an embodiment of a method of forming conductive patterns. FIGS. 10A and 10B illustrate a method of forming conductive patterns, based on an embodiment in which the first material layers 101 are configured as interlayer insulating layers and the second material layers 103 are configured as insulating layers having an etch selectivity with respect to the first material layers 101.

Referring to FIG. 10A, the second material layers 103 shown in FIG. 9C may be selectively removed through the slit 153. Accordingly, openings 157 may be defined between the first material layers 101.

Referring to FIG. 10B, the openings 157 shown in FIG. 10A may be respectively filled with conductive patterns 167. In an embodiment, the process of forming the conductive patterns 167 may include a process of forming a conductive barrier layer 163 along a surface of the openings 157 shown in FIG. 10A, a process of forming a metal layer 165 filling a central region of each of the openings 157 shown in FIG. 10A on a surface of the conductive barrier layer 163, and a process of isolating the conductive barrier layer 163 and the metal layer 165 into the conductive patterns 167.

Before the conductive patterns 167 are formed, a second blocking insulating layer 161 may be formed along the surface of each of the openings 157 shown in FIG. 10A.

Before the conductive patterns 167 are formed, a second blocking insulating layer 161 may be formed along the surface of each of the openings 157 shown in FIG. 10B.

FIGS. 10A and 10B illustrate the method, based on an embodiment in which the second material layers 103 shown in FIG. 9C are replaced with the conductive patterns 167. The process of forming the conductive patterns 167 is not limited to the above-described embodiment. In another embodiment, the second material layers 103 shown in FIG. 9C may be configured as conductive layers. The second material layers 103 may be isolated into conductive patterns by the slit 153.

Figure 11A:
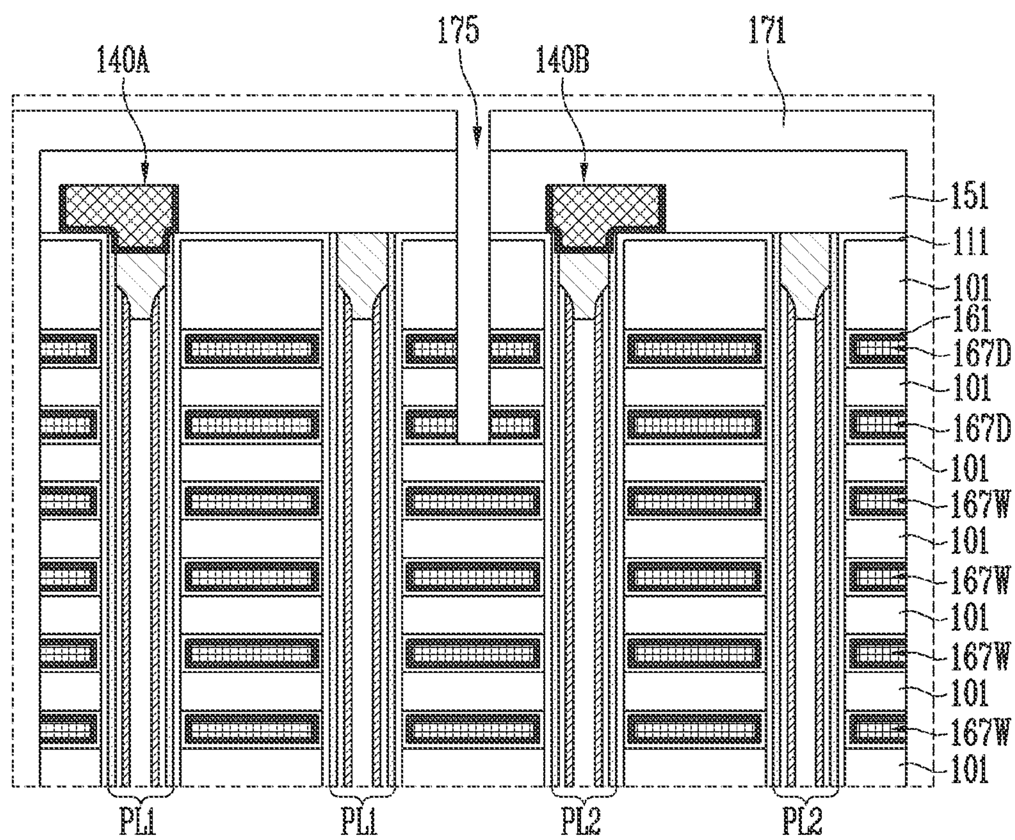
FIGS. 11A, 11B, and 11C are sectional views illustrating an embodiment of subsequent processes continued after the conductive patterns are formed.
Figure 11B:
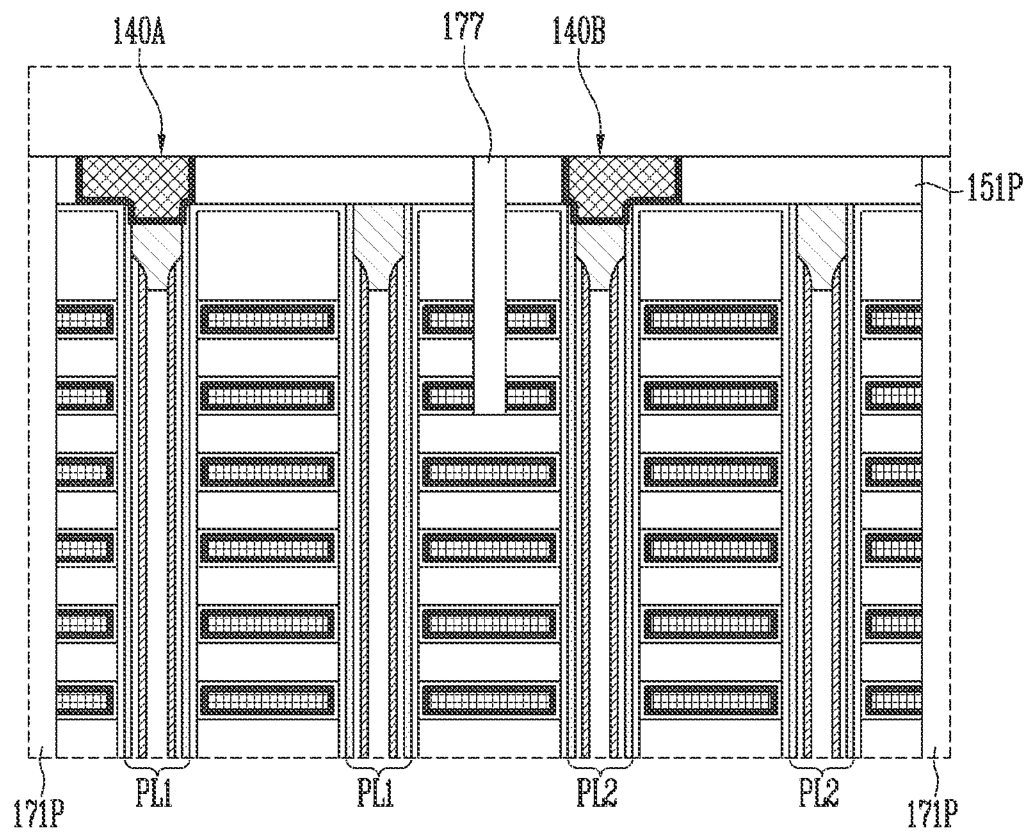
Figure 11C:
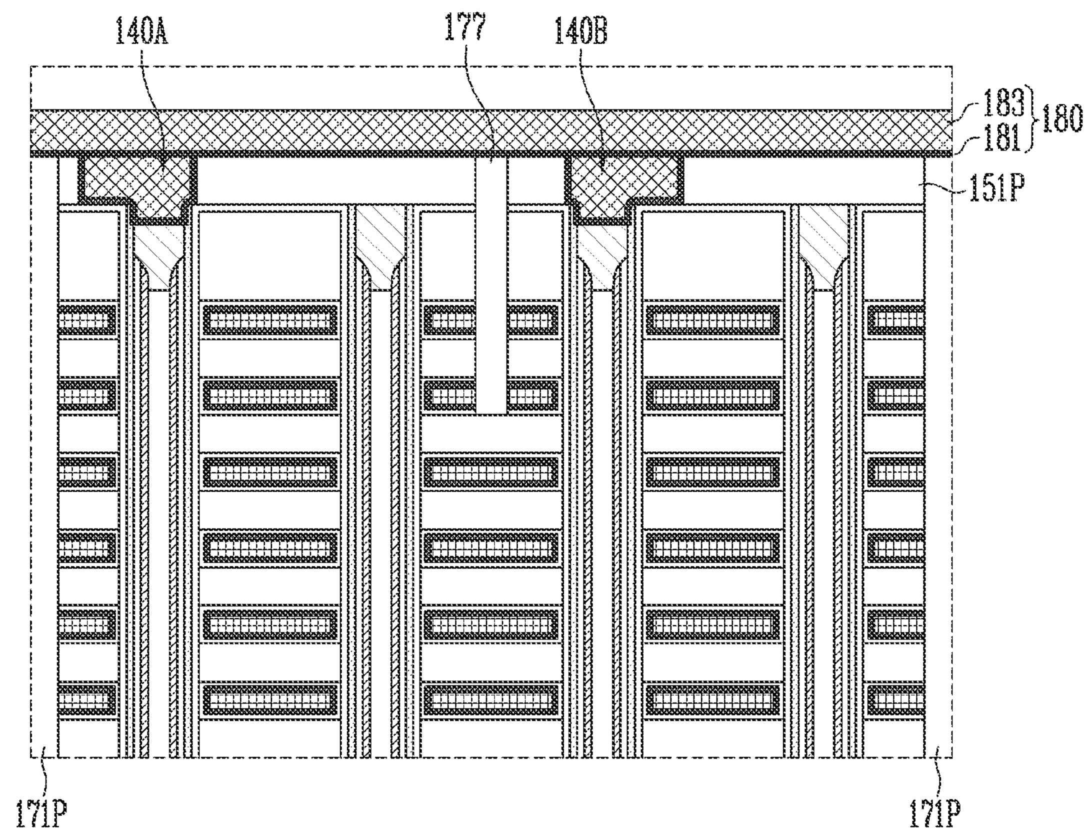

FIGS. 11A, 11B, and 11C are sectional views illustrating an embodiment of subsequent processes continued after the conductive patterns are formed.

Referring to FIG. 11A, a second insulating layer 171 may be formed, which fills the slit 153 shown in FIG. 10B and extends onto the first insulating layer 151.

Subsequently, a trench 175 may be formed, which penetrates the second insulating layer 171, the first insulating layer 151, and the first blocking insulating layer 111. The trench 175 may extend between the first pillar structure PL1 and the second pillar structure PL2, which are adjacent to each other. The trench 175 may penetrate at least one conductive pattern adjacent to the first insulating layer 151 among the conductive patterns 167 shown in FIG. 10B. Accordingly, drain select lines 167D isolated by the trench 175 may be defined. Conductive patterns which overlap with the drain select lines 167D and are not penetrated by the trench 175 may be defined as word lines 167W.

Referring to FIG. 11B, the trench 175 shown in FIG. 11A may be filled with an isolation insulating layer 177. Subsequently, a portion of the second insulating layer 171 shown in FIG. 11A and a portion of the first insulating layer 151 shown in FIG. 11A may be removed through a planarization process such that the first contact structure 140A and the second contact structure 140B are exposed. Hereinafter, the first insulating layer which is not removed through the planarization process but remains is defined as a first insulating pattern 151P. In addition, the second insulating layer which is not removed through the planarization process but remains is defined as a second insulating pattern 171P.

Referring to FIG. 11C, a bit line 180 may be formed on the first insulating pattern 151P and the isolation insulating layer 177. The bit line 180 may extend to be in contact with the first contact structure 140A and the second contact structure 140B. The bit line 180 may include a conductive barrier layer 181 and a metal layer 183.

Figure 12:
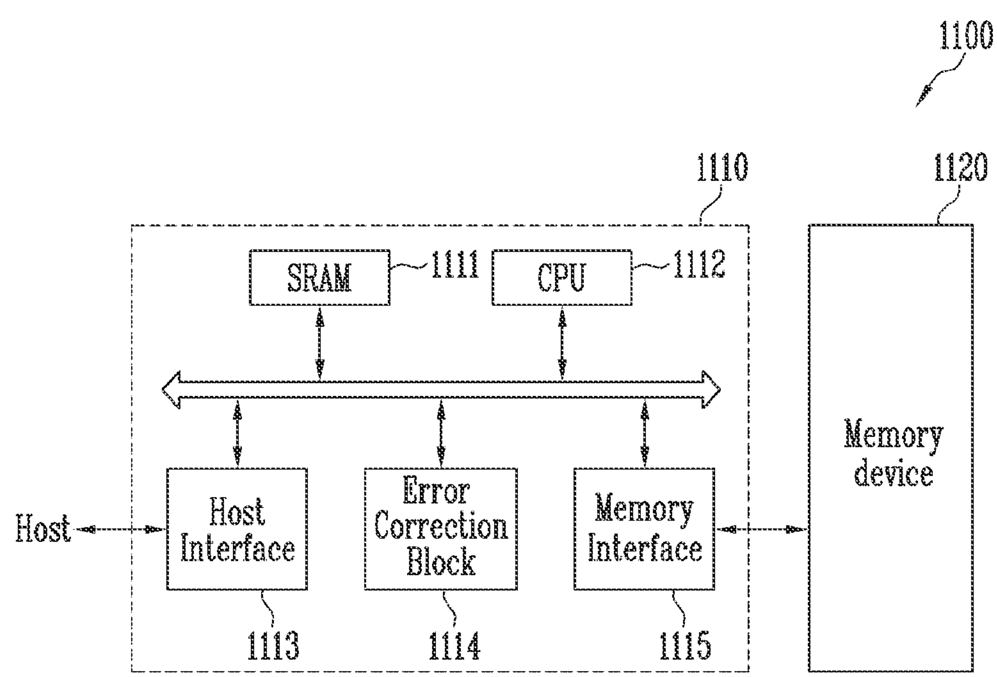
FIG. 12 is a block diagram illustrating a configuration of a memory system in accordance with an embodiment of the present disclosure.

FIG. 12 is a block diagram illustrating a configuration of a memory system in accordance with an embodiment of the present disclosure.

Referring to FIG. 12, the memory system 1100 includes a memory device 1120 and a memory controller 1110.

The memory device 1120 may include: a channel structure penetrating a gate stack structure; a contact structure in contact with the channel structure, the contact structure extending onto the gate stack structure, and a blocking insulating layer disposed between the channel structure and the gate stack structure, the blocking insulating layer extending between the contact structure and the gate stack structure. The memory device 1120 may be a multi-chip package configured with a plurality of flash memory chips.

The memory controller 1110 controls the memory device 1120, and may include Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include Read Only Memory (ROM) for storing code data for interfacing with the host, and the like.

Figure 13:
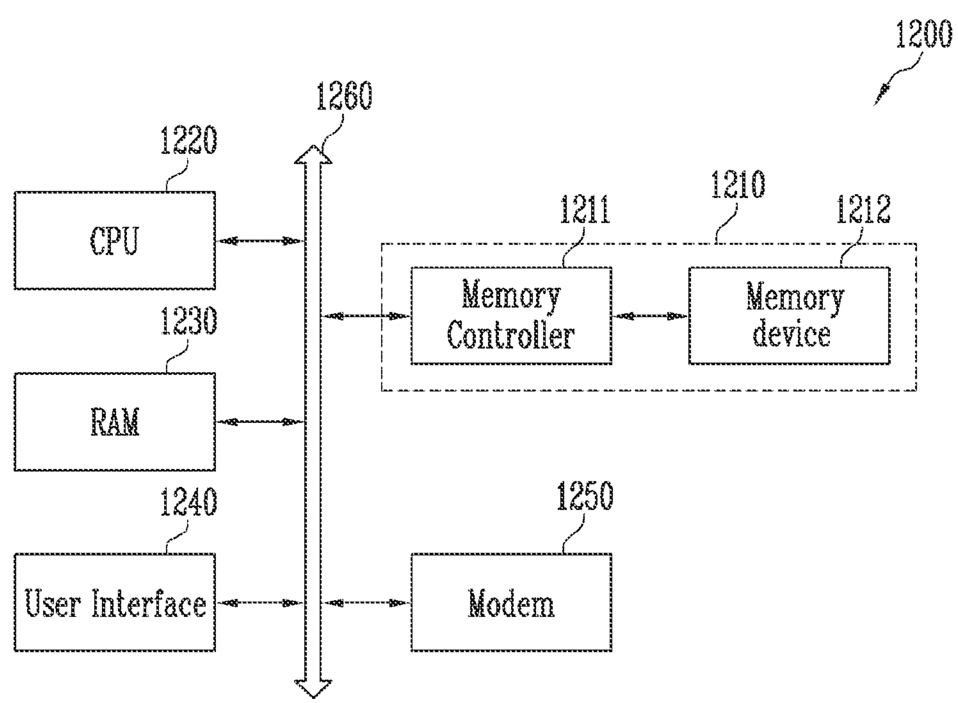
FIG. 13 is a block diagram illustrating a configuration of a computing system in accordance with an embodiment of the present disclosure.

FIG. 13 is a block diagram illustrating a configuration of a computing system 1200 in accordance with an embodiment of the present disclosure.

Referring to FIG. 13, the computing system 1200 in accordance with the embodiment of the present disclosure may include a CPU 1220, random access memory (RAM) 1230, a user interface 1240, a modem 1250, and a memory system 1210, which are electrically connected to a system bus 1260. The computing system 1200 may be a mobile device.

The memory system 1210 may be configured with a memory device 1212 and a memory controller 1211. The memory device 1212 may include a channel structure penetrating a gate stack structure, a contact structure in contact with the channel structure, the contact structure extending onto the gate stack structure, and a blocking insulating layer disposed between the channel structure and the gate stack structure, the blocking insulating layer extending between the contact structure and the gate stack structure.

In accordance with the present disclosure, a contact hole for providing a space in which a contact structure is to be disposed may be stably formed. Therefore, a process failure may be reduced.

What is claimed is:

1. A semiconductor memory device comprising:
- a gate stack structure including interlayer insulating layers and conductive patterns, which are alternately stacked;
- a first channel structure penetrating the gate stack structure;
- a first contact structure connected to the first channel structure, the first contact structure extending onto the gate stack structure;
- a bit line disposed on the first contact structure and being in contact with the first contact structure;
- a tunnel insulating layer disposed between the first channel structure and the gate stack structure;
- a data storage layer disposed between the tunnel insulating layer and the gate stack structure; and
- a blocking insulating layer disposed between the data storage layer and the gate stack structure, the blocking insulating layer extending between the first contact structure and the gate stack structure,
- wherein a distance between the bit line and the tunnel insulating layer is greater than a distance between the bit line and the blocking insulating layer.

2. The semiconductor memory device of claim 1, wherein the first channel structure includes:
- a core insulating layer extending in a stacking direction in which the interlayer insulating layers and the conductive patterns are stacked;
- a doped semiconductor pattern disposed between the first contact structure and the core insulating layer; and
- a channel layer surrounding the core insulating layer, the channel layer extending toward the bit line to be in contact with the doped semiconductor pattern.

3. The semiconductor memory device of claim 2,
- wherein a distance between the bit line and the channel layer is greater than the distance between the blocking insulating layer and the bit line.

4. The semiconductor memory device of claim 2,
- wherein the doped semiconductor pattern extends between the first contact structure and the tunnel insulating layer.

5. The semiconductor memory device of claim 2,
- wherein the first contact structure is formed of a conductive material having an etch selectivity different from that of the doped semiconductor pattern.

6. The semiconductor memory device of claim 2, wherein the first contact structure includes:
- a metal layer disposed in a central region of the first contact structure; and
- a conductive liner layer in contact with a surface of the metal layer and extending along a sidewall of the metal layer, wherein the surface of the metal layer faces the doped semiconductor pattern and the gate stack structure.

7. The semiconductor memory device of claim 6,
- wherein the conductive liner layer includes titanium (Ti) and titanium nitride (TiN), includes titanium nitride (TiN), or includes titanium silicide (TiSi).

8. The semiconductor memory device of claim 1, further comprising:
- a second channel structure penetrating the gate stack structure; and
- a second contact structure in contact with the second channel structure, the second contact structure extending to be in contact with the bit line.

9. The semiconductor memory device of claim 8, wherein the conductive patterns include:
- a word line surrounding the first channel structure and extending to surround the second channel structure;
- a first select line disposed between the bit line and the word line, the first select line surrounding the first channel structure; and
- a second select line disposed between the bit line and the word line, the second select line surrounding the second channel structure.

10. The semiconductor memory device of claim 9, further comprising an isolation insulating layer disposed between the first select line and the second select line, wherein the first contact structure and the second contact structure extend onto the gate stack structure in a direction moving away from the isolation insulating layer.

11. A method of manufacturing a semiconductor memory device, the method comprising:

forming channel holes penetrating a stack structure;

forming a blocking insulating layer including a vertical part disposed on a sidewall of each of the channel holes and a horizontal part extending along a top surface of the stack structure;

forming pillar structures respectively in the channel holes opened by the vertical part of the blocking insulating layer, wherein an upper end portion of each of the channel holes is opened;

forming a doped semiconductor layer including a first part filling the upper end portion of each of the channel holes and a second part extending from the first part, wherein the second part extends in a direction intersecting the first part to overlap with the stack structure;

forming contact holes respectively overlapping with the pillar structures by etching a portion of the doped semiconductor layer;

forming contact structures respectively filling the contact holes; and removing the second part of the doped semiconductor layer.

12. The method of claim 11, wherein the forming of the pillar structures includes:

sequentially forming a data storage layer, a tunnel insulating layer, and a channel layer on the blocking insulating layer;

forming a core insulating layer in a central region of each of the channel holes, which is opened by the channel layer, wherein the upper end portion of each of the channel holes is opened by the core insulating layer;

removing a portion of the channel layer and a portion of the tunnel insulating layer such that the data storage layer is exposed through the upper end portion of each of the channel holes; and removing a portion of the data storage layer such that the horizontal part of the blocking insulating layer is exposed.

13. The method of claim 11, wherein the forming of the contact holes is performed such that the first part of the doped semiconductor layer is exposed.

14. The method of claim 11, wherein each of the contact holes extends in a direction intersecting the pillar structures to overlap with the stack structure.

15. The method of claim 11, wherein each of the contact structures is made of a conductive material having an etch selectivity different from that of the doped semiconductor laver.

16. The method of claim 11, wherein the forming of the contact structures includes:

forming a conductive liner layer in contact with the doped semiconductor layer along a surface of each of the contact holes; and forming a metal layer filling a central region of each of the contact holes on the conductive liner layer.

17. The method of claim 16, wherein the conductive liner layer includes titanium (Ti) and titanium nitride (TiN), includes titanium nitride (TiN), or includes titanium silicide (TiSi).

18. The method of claim 11, wherein the removing of the second part of the doped semiconductor layer is performed such that the doped semiconductor layer is isolated into doped semiconductor patterns respectively overlapping with the pillar structures.

19. The method of claim 11, wherein a portion of the first part of the doped semiconductor layer is exposed by removing the second part of the doped semiconductor layer.

20. The method of claim 11, wherein the stack structure includes first material layers and second material layers, which are alternately stacked, wherein the pillar structures include a first pillar structure and a second pillar structure, which penetrate the first material layers and the second material layers, and wherein the contact structures include a first contact structure overlapping with the first pillar structure and a second contact structure overlapping with the second pillar structure.

21. The method of claim 20, further comprising:

after the removing of the second part of the doped semiconductor layer, forming an insulating layer covering the first and second contact structures;

forming a slit penetrating the insulating layer, the blocking insulating layer, and the first and second material layers;

replacing the second material layers with conductive patterns through the slit;

forming an isolation insulating layer penetrating at least one conductive pattern adjacent to the insulating layer among the conductive patterns between the first pillar structure and the second pillar structure;

removing a portion of the insulating layer such that the first and second contact structures are exposed; and forming a bit line in contact with the first and second contact structures, the bit line extending onto a remaining portion of the insulating layer.

* * * * *